(12) United States Patent
Salowe

(10) Patent No.: US 9,075,932 B1
(45) Date of Patent: Jul. 7, 2015

(54) METHODS AND SYSTEMS FOR ROUTING AN ELECTRONIC DESIGN USING SPACETILES

(75) Inventor: Jeffrey S. Salowe, Los Gatos, CA (US)

(73) Assignee: Candence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/602,069

(22) Filed: Aug. 31, 2012

(51) Int. Cl.
*G06F 17/50* (2006.01)

(52) U.S. Cl.
CPC ...................................... *G06F 17/50* (2013.01)

(58) Field of Classification Search
None
See application file for complete search history.

(56) References Cited

U.S. PATENT DOCUMENTS

| | | | |
|---|---|---|---|
| 4,484,292 A | 11/1984 | Hong et al. | |
| 4,811,237 A | 3/1989 | Putatunda et al. | |
| 5,535,134 A | 7/1996 | Cohn et al. | |
| 5,644,500 A | 7/1997 | Miura et al. | |
| 6,011,912 A | 1/2000 | Yui et al. | |
| 6,298,468 B1 | 10/2001 | Zhen | |
| 6,324,675 B1 * | 11/2001 | Dutta et al. | 716/130 |
| 6,349,403 B1 | 2/2002 | Dutta et al. | |
| 6,407,434 B1 | 6/2002 | Rostoker et al. | |
| 6,490,713 B2 | 12/2002 | Matsumoto | |
| 6,505,333 B1 | 1/2003 | Tanaka | |
| 6,543,041 B1 | 4/2003 | Scheffer et al. | |
| 6,557,145 B2 | 4/2003 | Boyle et al. | |
| 6,763,512 B2 | 7/2004 | Xing | |
| 6,769,105 B1 * | 7/2004 | Teig et al. | 716/122 |
| 6,813,755 B2 | 11/2004 | Xing | |
| 6,851,100 B1 | 2/2005 | You et al. | |
| 6,892,371 B1 * | 5/2005 | Teig et al. | 716/129 |
| 6,938,234 B1 * | 8/2005 | Teig et al. | 716/129 |
| 6,957,407 B2 | 10/2005 | Suto | |
| 6,957,411 B1 * | 10/2005 | Teig et al. | 716/55 |
| 6,981,235 B1 * | 12/2005 | Salowe et al. | 716/111 |
| 6,996,512 B2 | 2/2006 | Alpert et al. | |
| 7,016,794 B2 | 3/2006 | Schultz | |
| 7,051,313 B1 | 5/2006 | Betz et al. | |
| 7,076,750 B1 | 7/2006 | Lukanc | |
| 7,089,526 B1 | 8/2006 | Salowe et al. | |
| 7,096,445 B1 * | 8/2006 | Pucci et al. | 716/119 |
| 7,100,128 B1 * | 8/2006 | Nequist et al. | 716/111 |
| 7,117,468 B1 * | 10/2006 | Teig et al. | 716/129 |
| 7,222,322 B1 * | 5/2007 | Chyan et al. | 716/122 |

(Continued)

OTHER PUBLICATIONS

Dion et al., Contour: A Tile-based Gridless Router, 30 pages, Western Research Laboratory, Mar. 1995.*

(Continued)

*Primary Examiner* — A. M. Thompson
(74) *Attorney, Agent, or Firm* — Vista IP Law Group, LLP

(57) ABSTRACT

Various embodiments identify a routing layer of an electronic design, create spacetile(s) by performing spacetile punches for the muting layer, identify an area probe from the spacetiles, and routes the electronic design by using the one or more area probes for performing area search for routing solutions. Some embodiments identify two routing layers of an electronic design, perform spacetile punches to form spacetiles for the routing layers, determine a via spacetile layer, identify spacetiles as one or more area probes based on the via spacetile layer, and routes the electronic design by using the one or more area probes for performing area search for routing solutions while transitioning between the two muting layers. One of the two routing layers may be a tracked muting layer, and the other may be a trackless routing layer. The tracked muting may be gridded or gridless.

21 Claims, 21 Drawing Sheets

(56) References Cited

U.S. PATENT DOCUMENTS

| | | | |
|---|---|---|---|
| 7,257,797 | B1 | 8/2007 | Waller et al. |
| 7,363,607 | B2 | 4/2008 | Birch et al. |
| 7,516,433 | B1 * | 4/2009 | Pucci et al. .................. 716/119 |
| 7,523,430 | B1 | 4/2009 | Patel |
| 7,594,214 | B1 | 9/2009 | Salowe et al. |
| 7,802,208 | B1 | 9/2010 | Waller et al. |
| 7,958,480 | B1 | 6/2011 | Slonim et al. |
| 8,006,216 | B1 | 8/2011 | Chen et al. |
| 8,375,348 | B1 * | 2/2013 | Raj et al. ....................... 716/126 |
| 8,418,110 | B2 | 4/2013 | Keinert et al. |
| 2003/0014201 | A1 | 1/2003 | Schultz |
| 2006/0288323 | A1 | 12/2006 | Birch |
| 2008/0072182 | A1 | 3/2008 | He et al. |
| 2010/0106274 | A1 | 4/2010 | Konno et al. |
| 2011/0185329 | A1 | 7/2011 | Wen et al. |
| 2011/0260318 | A1 | 10/2011 | Eisenstadt |
| 2013/0155555 | A1 | 6/2013 | Blanc et al. |

OTHER PUBLICATIONS

Non-Final Office Action dated Sep. 19, 2013 for U.S. Appl. No. 13/602,071.

Notice of Allowance dated Mar. 21, 2014 for U.S. Appl. No. 13/602,071.

Final Office Action dated Oct. 4, 2013 for U.S. Appl. No. 13/705,164.

Non-Final Office Action dated Jun. 5, 2013 for U.S. Appl. No. 13/705,164.

Notice of Allowance dated Jan. 22, 2014 for U.S. Appl. No. 13/705,164.

Notice of Allowance dated May 16, 2014 for U.S. Appl. No. 13/705,164.

Hwang, Chanseok, and Massoud Pedram. "Interconnect design methods for memory design." Proceedings of the 2004 Asia and South Pacific Design Automation Conference. IEEE Press, 2004.

Jeffrey Salowe, "Gridding for Advanced Process Nodes" 2012.

Lin, I-Jye, Tsui-Yee Ling, and Yao-Wen Chang. "Statistical circuit optimization considering device and interconnect process variations." Proceedings of the 2007 international workshop on System level interconnect prediction. ACM, 2007.

Ou, Hung-Chih, Hsing-Chih Chang Chien, and Yao-Wen Chang. "Simultaneous analog placement and routing with current flow and current density considerations." Proceedings of the 50th Annual Design Automation Conference. ACM, 2013.

Pompl, T., et al. "Practical aspects of reliability analysis for IC designs." Proceedings of the 43rd annual Design Automation Conference. ACM, 2006.

Singh, Jaskirat, and Sachin S. Sapatnekar. "Topology optimization of structured power/ground networks." Proceedings of the 2004 international symposium on Physical design. ACM, 2004.

Notice of Allowance dated Jul. 14, 2014 for U.S. Appl. No. 13/602,071.

Non-Final Office Action dated Sep. 3, 2014 for U.S. Appl. No. 13/705,164.

Non-Final Office Action dated Jul. 15, 2014 for U.S. Appl. No. 14/044,838.

Notice of Allowance dated Apr. 2, 2015 for U.S. Appl. No. 13/705,164.

Non-Final Office Action dated Mar. 10, 2015 for U.S. Appl. No. 14/318,507.

* cited by examiner

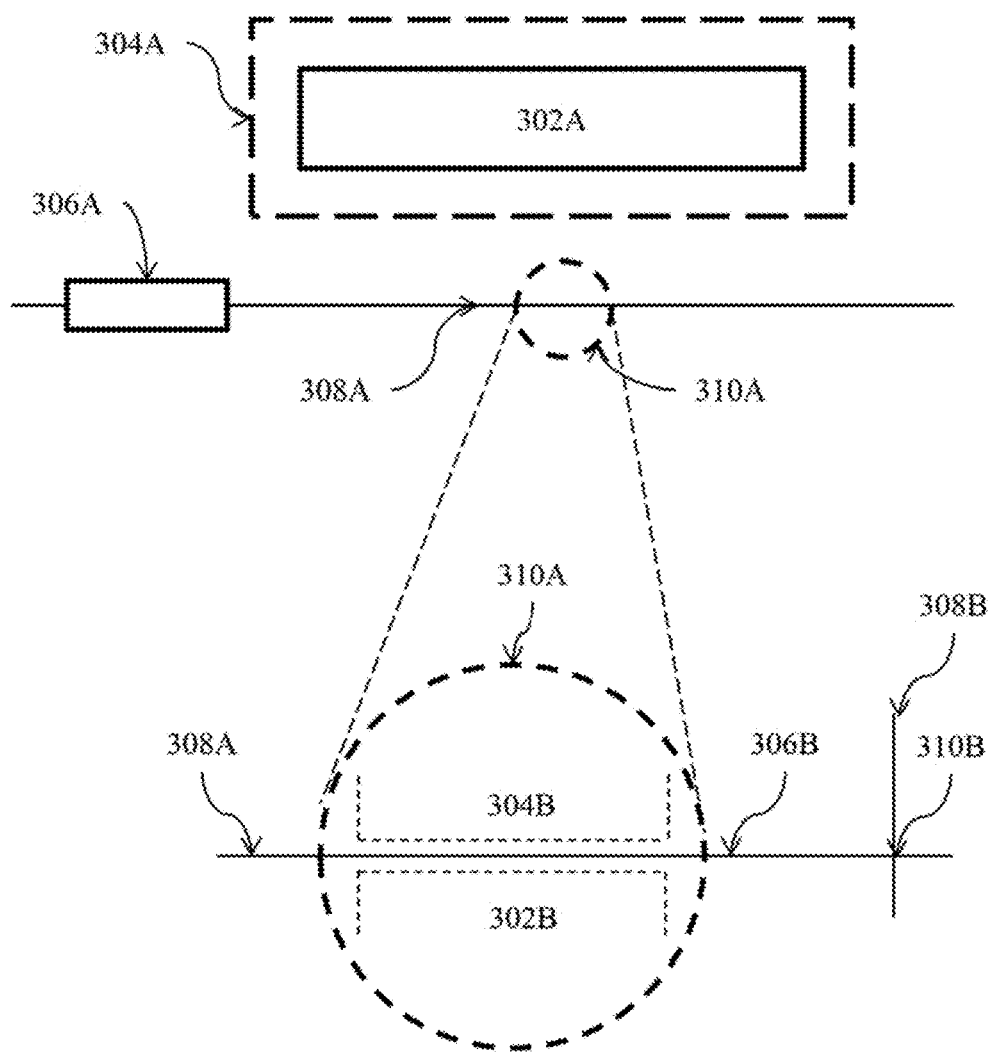

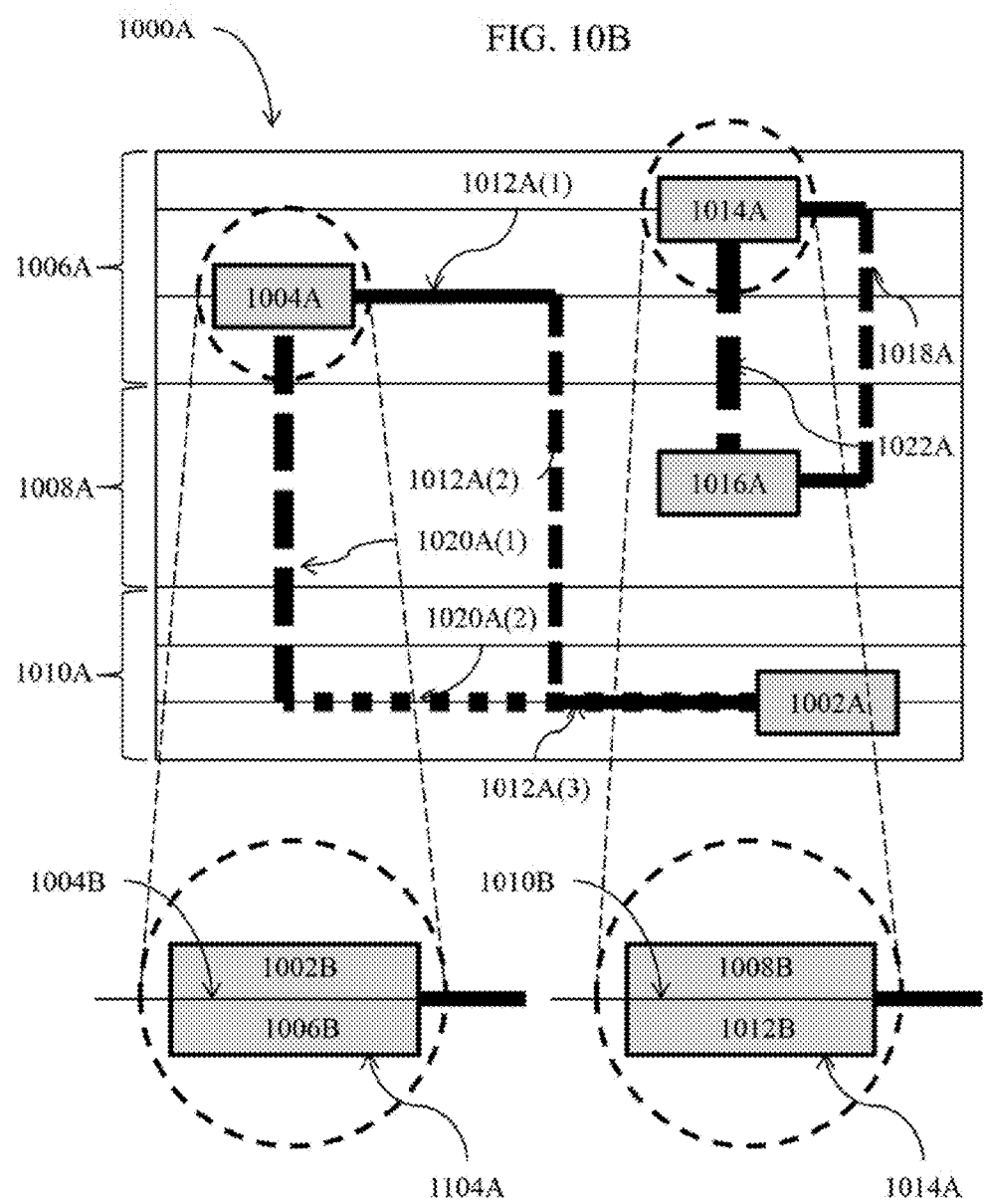

METHODS AND SYSTEMS FOR ROUTING AN ELECTRONIC DESIGN USING SPACETILES

CROSS-REFERENCE TO RELATED APPLICATION(S)

The instant application is related to U.S. patent application Ser. No. 13/602,071, which is entitled "METHODS, SYSTEMS, AND ARTICLES OF MANUFACTURE FOR ROUTING AN ELECTRONIC DESIGN USING SPACETILES" and is filed concurrently with the instant Application. The content of the aforementioned U.S. Patent Application is hereby expressly incorporated by reference in its entirety for all purposes.

BACKGROUND

Integrated circuits, or ICs, are created by patterning a substrate and materials deposited on the substrate. The substrate is typically a semiconductor wafer. The patterned features make up devices and interconnections. This process generally starts with a designer creating an integrated circuit by hierarchically defining functional components of the circuit using a hardware description language. From this high-level functional description, a physical circuit implementation dataset is created, which is usually in the form of a netlist. This netlist identifies logic cell instances from a cell library, and describes cell-to-cell connectivity.

Many phases of these electronic design activities may be performed with computer aided design (CAD) tools or electronic design automation (EDA) systems. For example, an integrated circuit designer may use a set of layout EDA application programs, such as a layout editor, to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters. The EDA layout editing tools are often performed interactively so that the designer can review and provide careful control over the details of the electronic design.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist. The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

A layout file is created from the placement and routing process, which assigns logic cells to physical locations in the device layout and routes their interconnections. The physical layout is typically described as many patterned layers, and the pattern of each layer is described by the union of a set of polygons. The layout data set is stored, for example in GDSII ("Graphic Data System II") or OASIS ("Open Artwork System Interchange Standard") formats. Component devices and interconnections of the integrated circuit are constructed layer by layer. A layer is deposited on the wafer and then it is patterned using a photolithography process and an etch process.

In modern integrated circuits, complex routing rules have led some customers to use restrictive routing rules. For example, some foundries impose upon the circuit designers some routing rules that require the center line of a route or an interconnect to align with a track, and some other routing rules that require interconnects of certain widths only be aligned with certain tracks. Nonetheless, some electronic designs may be routed with a grid-based approach, whereas some others may be routed with a gridless approach. Similarly, some electronic designs may be routed by using a track-based approach, whereas some other electronic designs may be routed by using a trackless approach. In addition, different electronic designs may have different spacing(s) for grids or tracks, but the foundries may require more regular grids or tracks.

Thus, there exists a need for a method, a system, and an article of manufacture for routing an electronic design using spacetiles.

SUMMARY

Disclosed are method(s), system(s), and article(s) of manufacture for routing an electronic design by using spacetiles. In one or more embodiments, the method for routing an electronic design comprises an act of identifying a first layer. In some embodiments, a layer, in the physical sense, comprises a thin film that is placed on a semiconductor substrate or on another thin film for manufacturing the electronic circuit by using various processing techniques such as deposition, plating, etc. Some typical examples of such physical layers of an electronic circuit may include metal layers, dielectric layers, etc. The layer that is identified by the method in some embodiments may comprise a routing layer in the electronic design that corresponds to one of the physical layers or a part thereof.

In some embodiments, the identified layer may comprise tracks. A track may comprise a line of zero thickness on which the centerline of an interconnect lies. In some embodiments where a preferred or default routing direction is defined, a track along the preferred or default routing direction is called a right-way track. A track that does not lie along the preferred or default routing direction is called a wrong-way track in these embodiments. For example, in a Manhattan routing approach, preferred or default routing directions of two adjacent metal layers (with a dielectric layer in between) are perpendicular to each other. If the lower metal layer is associated with a horizontal routing direction, then the horizontal tracks, if any, on the lower metal layer may be deemed the "right-way tracks". If the lower metal layer is further associated with vertical tracks, these vertical tracks are then deemed as the "wrong-way tracks" because they do not lie along the horizontal routing directions.

The upper metal layer may also be associated with a vertical routing direction in this example. The vertical tracks, if any, on the upper metal layer will then be deemed as the "right-way tracks" because they do lie along the vertical routing direction of the upper metal layer. The horizontal tracks on the upper metal layer, if any, will then be deemed as the wrong-way tracks because they do not lie along the vertical routing direction of the upper metal layer. It shall be noted that the aforementioned definitions of right-way tracks and wrong-way tracks are not limited to Manhattan routing directions that are perpendicular to each other and may also applied to two routing directions at an oblique angle for a given layer. In some embodiments where a layer is associated with some tracks, the layer may be deemed "tracked" or "track-based", which are used interchangeably in this application. A layer will be deemed trackless or not track-based if the layer is not associated with any tracks (e.g., no right-way tracks and wrong-way tracks.)

In some embodiments where a layer is associated with both the right-way tracks and the wrong-way tracks, the layer may be deemed as gridded or grid-based. In these embodiments, a grid is defined by the intersection of a right-way track and a wrong-way track. If a layer is associated with only one set of tracks (e.g., right-way tracks) but not the other (e.g., wrong-way tracks), the layer may be deemed gridless or not grid-based. Therefore, a gridded layer is always tracked because a gridded layer requires the tracks in the preferred or default routing direction (e.g., right-way tracks) and in the other direction (e.g., wrong-way tracks) to determine the grids, which are the intersections of the two sets of tracks. On the other hand, a gridless layer may be tracked or trackless because a gridless layer may contain only one set of tracks (e.g., the right-way tracks) or no tracks at all. In some embodiments where a gridless layer contains only one set of tracks, the layer is nonetheless tracked or track based. In some other embodiments where a gridless layer contains no tracks at all in either direction, the gridless layer is also trackless.

It shall be noted that various embodiments disclosed herein apply with equal effect to any tracked or trackless layer and also to any gridded or gridless layer. If shall also be noted that various embodiments disclosed herein apply with equal effect to a layer which may include tracks (right-way tracks or both right-way and wrong-way tracks) in a smaller portion of the layer whereas the remainder of the layer is trackless. If shall also be noted that various embodiments disclosed herein apply with equal effect to a layer which may be gridded in a smaller portion of the layer whereas the remainder of the layer is gridless or even trackless.

On the other hand, a trackless layer is always gridless because there exist no tracks at all on the layer to form grids. If shall also be noted that various embodiments disclosed herein apply with equal effect to a layer which may include non-uniform tracks or non-uniform grids in some embodiments. These embodiments do not require uniform tracks or uniform grids for achieving the all the intended purposes. Some embodiments further distinguish between a soft track and a hard track. A hard track is enforced by one or more design rules that require an interconnect to stay on a track and prohibit any off-track interconnects. A soft track may be enforced by one or more design rules that require an interconnect to stay on a track to the extent possible and may allow some off-track interconnects if the on-track requirements cannot be successfully enforced without increasing, for example, the cost, difficulty, etc. beyond some permissible thresholds or without causing other violations of, for example, one or more design rules.

It shall also be noted that the grids described herein refer to the routing grids, which are formed by electronic design automation (EDA) tools while routing an electronic design. A place and route tool may then place and route among the routing grids, which may be defined by the EDA tools, the circuit designers, or the design rules. A placement tool may also define or use placement grids, which may be determined to be multiples of the size of the manufacturing grids, to align cells, macros, blocks, etc. in the design. Manufacturing grids are defined by the foundries that reference the manufacturing grids, for example, for mask design and manufacturing to fabricate the electronic circuits according to their designs. Manufacturing grids are process specific because these grids usually represent the resolution threshold for specific manufacturing processes and are usually specified in technology files or a file that includes a specification for representing the physical layout of an electronic circuit (e.g., an LEF (library exchange format) file.) A typical manufacturing grid for 18 micron technology nodes is 5 nanometers. In other words, manufacturing grids exist because these grids are imposed by the foundries, and manufacturing grids are usually uniform. Unless otherwise expressly specified, a grid or grids refer to a routing grid or routing grids in this application. Nonetheless, it shall be noted that some embodiments may leverage the existing of the manufacturing grids to achieve various intended purposes because such manufacturing grids are imposed by the foundries.

In one or more embodiments, the method for routing an electronic design comprises an act of identifying a second layer. In some embodiments, the first layer comprises a tracked layer and the second layer comprises a trackless layer. In one or more embodiments, the method for routing an electronic design comprises an act of identifying a via layer between the first layer and the second layer. For example, the first layer may constitute the metal 1 layer, the second layer may constitute the metal 2 layer, and the via layer may constitute a dielectric layer between the metal 1 and metal 2 layers. In one or more embodiments, the method for routing an electronic design comprises an act of transitioning between the first layer and the second layer to route the metal 1 or the metal 2 layer by using one or more area probes or spacetiles. In these embodiments, the method transitions between a tracked layer and a trackless layer and performs routing by using one or more spacetiles or one or more area probes.

In one or more embodiments, the method for routing an electronic design comprises an act of identifying a routing layer. The method may further comprise the act of performing a spacetile punch for the routing layer in some embodiments. In these embodiments, the spacetile punch identifies usable routing space in the routing area and subdivides the routing space into one or more spacetiles. The spacetile punch subdivides the routing space according to at least one or more design rules (e.g., one or more spacing rules or one or more width rules for interconnects, etc.) into one or more spacetiles. It shall be noted that the recitation of "a spacetile punch" does not necessarily a single spacetile punch. Rather, the recitation of "a spacetile punch" refers to the performance of the spacetile punch process, which is explained in greater details below, and thus may include one or more "spacetile punches".

A spacetile comprises an n-dimensional geometric entity in the routing space in some embodiments. The method may then identify a spacetile as an area probe to guide a router (e.g., a point-to-point router that routes an interconnect between two points in the design) to perform area search for routing an electronic design. An area probe may be used to store information such as the information about the spacetile itself, various information about routing the interconnect (e.g., destination location, beginning location, etc.) in some embodiments. In some embodiments, the method may further mark or label the spacetiles.

For example, the method may mark or label a spacetile as "on-track" or "off-track" based on the relationship between the spacetile and a track. In some embodiments, the method may further optionally comprise the act of determining costs of the one or more spacetiles from the spacetile punch. In some embodiments, the method may further comprise the act of determining whether there exist one or more constraints for routing some interconnects.

For example, the method may determine whether there exists a constraint that requires an interconnect to be routed along one or more tracks. In some embodiments, the method may further comprise the act of determining whether soft tracks are permitted in routing the electronic design or a portion thereof, or whether only hard tracks may be used in routing the electronic design or a portion thereof. In some embodiments, the method may further comprise the act of routing the electronic design with area search by using one or more area probes, which may be identified from the one or more spacetiles from the spacetile punch. In some of these embodiments, the method may optionally base the routing of the electronic design on costs associated with the one or more area probes, on the one or more constraints, or on whether soft tracks are permitted in routing the electronic design or a portion thereof. Various details of any of the processes or sub-processes are further provided in the Detailed Description section below.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 3A illustrates an exemplary spacetile punch in some embodiments.

FIG. 3B illustrates more details of the exemplary spacetile punch of FIG. 3A in some embodiments.

FIGS. 10A-B illustrate some examples of routing a layer of the electronic design that comprises tracked regions with different track spacing distances and a trackless region in some embodiments.

DETAILED DESCRIPTION

Figure 1:
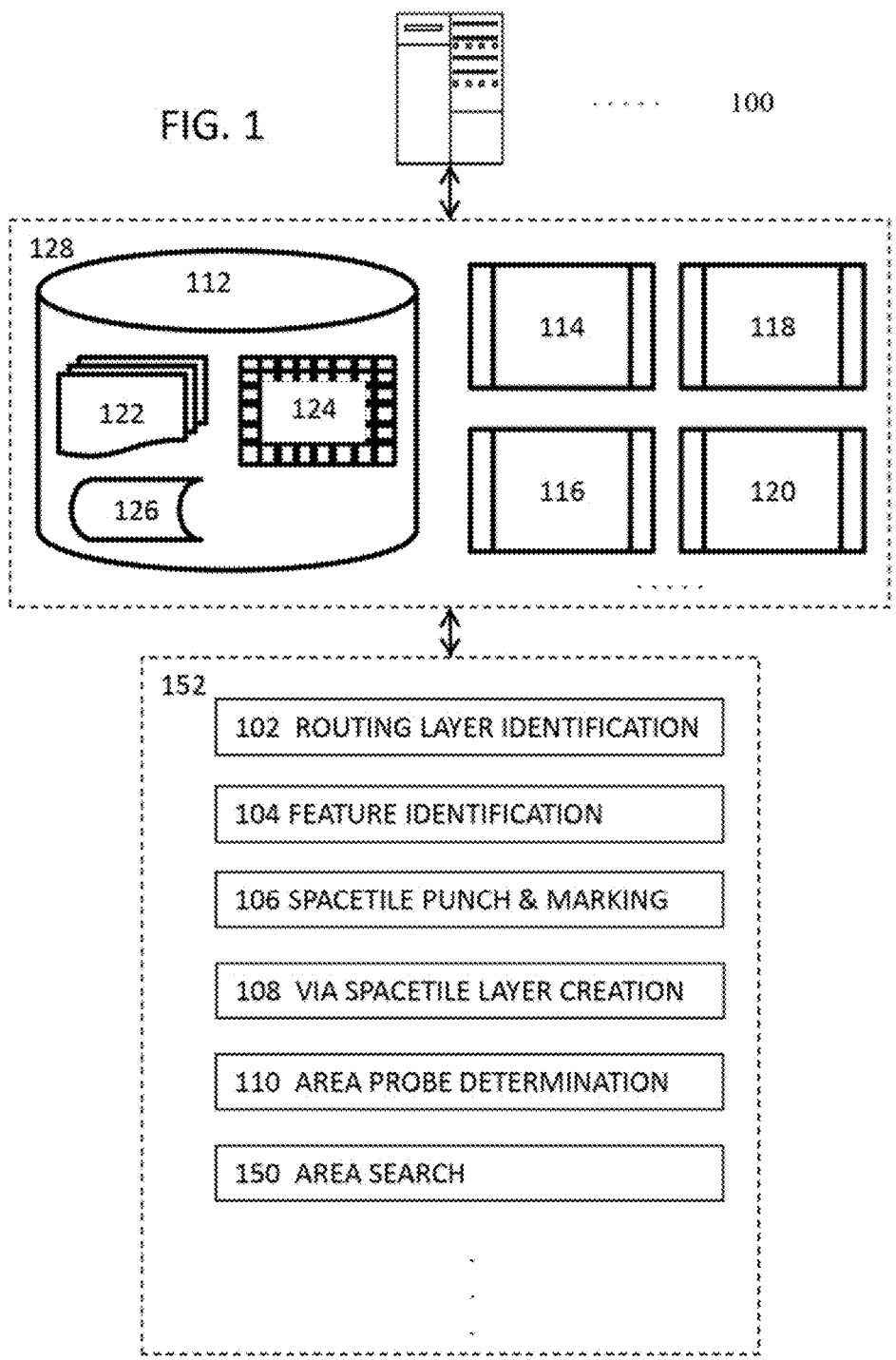
FIG. 1 illustrates a high level block diagram for a system for routing an electronic circuit using spacetiles in some embodiments.

Various embodiments of the invention are directed to a methods, systems, and articles of manufacture for routing an electronic design using spacetiles. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are method(s), system(s), and article(s) of manufacture for routing an electronic circuit using spacetiles in one or more embodiments. Various embodiments identify a first layer and a second layer of the electronic design. In some embodiments, the first layer comprises a tracked or gridded layer, and the second layer comprises a trackless (and hence gridless) layer. In some embodiments, the first layer comprises a gridded layer, and the second layer comprises a gridless (but not necessarily trackless) layer. Some embodiments then identify or determine a via layer between the first layer and the second layer and performs routing by using spacetiles on the first layer or the second layer and transitions from the first layer to the second layer via the via layer, or vice versa.

Some embodiments identify a routing layer and then performs a spacetile punch to form one or more spacetiles for the routing layer depending upon whether or not the routing layer is associated with tracks or grids. Some embodiments further optionally determine or identify costs and associated the costs with the one or more spacetiles from the spacetile punch. Some embodiments further optionally determine whether or not there exist one or more constraints for routing some interconnect within a certain region of an electronic circuit design. Some embodiments further optionally determine or identify whether or not soft tracks are permitted in routing at least a part of an electronic circuit or at least a portion of a layer thereof. These embodiments may further route the electronic circuit or a layer or a portion of a layer thereof by identifying and using one or more area probes based on the one or more spacetiles from the spacetile punch. Various details of any of the processes, sub-processes, or acts are further provided below with reference to respective drawing figures.

FIG. 1 illustrates a high level block diagram for a method or a system for in some embodiments. In one or more embodiments, the system for routing an electronic design using spacetiles may comprise the hardware module In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine 114, a detail routing engine 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises a routing layer identification module 102, a feature identification module 104, a spacetile punch module or a spacetile punch and labeling module 104, a via spacetile layer creation module 108, an area probe determination module 110, an area search module 150, etc.

Figure 2A:
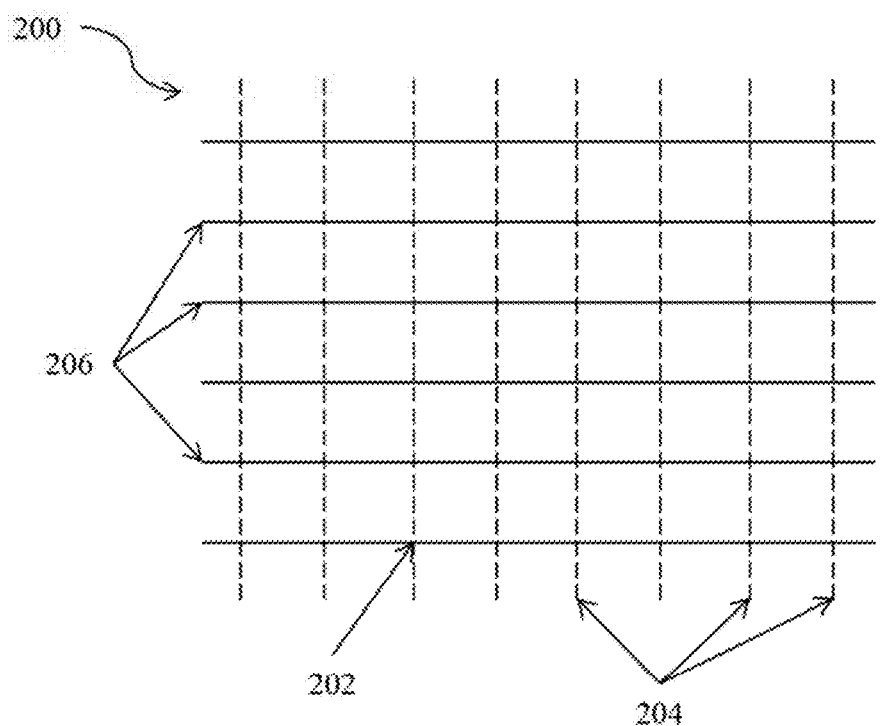
FIG. 2A illustrates an exemplary diagram showing track in a region of an electronic design in some embodiments.

FIG. 2A illustrates an exemplary diagram showing track in a region of an electronic design in some embodiments. This exemplary diagram illustrates a portion of a layer 200 that includes a set of horizontal tracks 206 and a set of vertical tracks 204. The intersection of a horizontal track and a vertical track defines a grid 202. In other words, FIG. 2A illustrates a gridded portion of a layer of an electronic design. One of the two sets of tracks (e.g., the set of horizontal tracks 206) may be identified as the right-way tracks based on the preferred or default routing direction of the region, and the other set of tracks (e.g., the set of vertical tracks 204) may be identified as the wrong-way tracks based also on the preferred or default routing direction of the region.

Figure 2B:
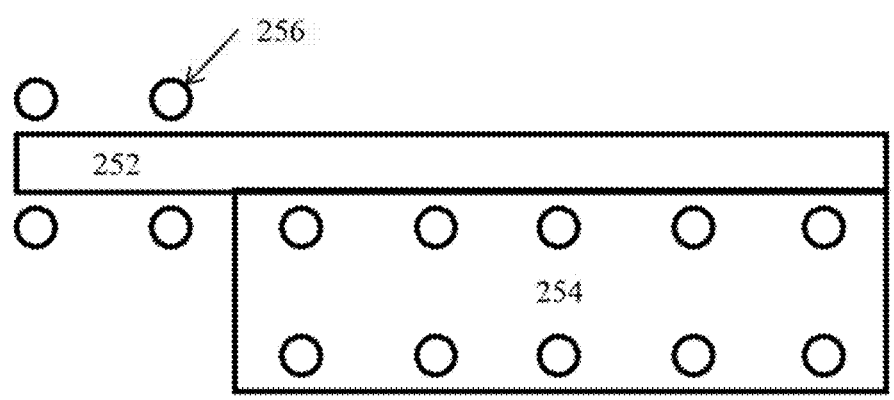
FIG. 2B illustrates an exemplary diagram showing the use of area probes in a gridded portion of a layer of an electronic design in some embodiments.

FIG. 2B illustrates an exemplary diagram showing the use of area probes in a gridded portion of a layer of an electronic design in some embodiments. The circles in FIG. 2B graphically represent the grids although a grid is determined at an intersection of two tracks (not shown.) In other words, FIG. 2B uses circles to represent grids (e.g., reference character 256) for the ease of illustration but does not intend to imply that a grid may be associated with a certain size or a certain shape. FIG. 2B shows two exemplary area probes 252 and 254. An area probe represents a n-dimensional geometric entity in which or on which the center line(s) of interconnect(s) may lie and thus may be used by various embodiments of the method or system to perform area search in order to determine the route for an interconnect. An area probe may be used to store information such as the information about the spacetile itself, various information about routing the interconnect (e.g., exact or approximate location, distance, or direction of the destination, exact or approximate location, direction, or distance of the beginning point of the route, or associated design rule(s), etc.) to guide search for routing the interconnect through the spacetiles in some embodiments. In some embodiments where a route is required to go through one or more grids in the example illustrated in FIG. 2B, the method or system may adopt the area probe 254, but not the area probe 252, because area probe 252 comprises an area that does not include any grids.

FIG. 3A illustrates an exemplary spacetile punch in some embodiments. More specifically, FIG. 3A illustrates a first circuit component 302A (e.g., a cell or a blockage), a second circuit component (e.g., a pin) 306A, and a track 308A. The method or system may perform a spacetile punch for the track 308A, the first circuit component 302A, and the second circuit component 306A in some embodiments. More details for the spacetile punch for a pin will be described in greater details in subsequent paragraphs. In some embodiments, the method or system may identify one or more design rules, constraints, or requirements for the first circuit component 302A and perform a spacetile punch to punch out the space enclosed by the rectangular shape 304A. For example, the method or system may identify a first spacing rule along the longer side of the first component 302A and a second spacing rule along the shorter side of the first component 302A.

The method and the system may further identify permissible wire width(s) for an interconnect and then punch out the space enclosed by 304A. The length (the size of the longer side of 304A) may be determined to be the length of 302A (the size of the longer side of 302A) plus twice the sum of the first spacing requirement and half of the wire width due to the presence of the second circuit component 306A.

It shall be noted that this does not necessarily imply that the width (the size of the shorter side of 304A) is to be the width of 302A (shorter side of 302A) plus twice the amount of the sum of the second spacing requirement and half of the wire width unless the spacing requirement between the shorter side of 302A and an adjacent wire or circuit component remains identical to the second spacing requirement. In some embodiments, where the spacing requirements depend upon the parallel run length between two circuit components, the spacing requirement for the shorter side of 302A is more likely different from the second spacing requirement for the longer side of 302A due to the longer parallel run length between 302A and, for example, 306A. In these embodiments, 304A may be a quadrilateral but not a rectangle. Nonetheless, 304A is illustrated as a rectangle in FIG. 3A for the sole purpose of illustration and explanations.

In some embodiments, the spacing requirement may also vary with the parallel run length of the interconnect wire, and the area defined by 304A is thus a trapezoidal shape, rather than a rectangular shape. In some embodiments, the spacing requirement may be identical on all sides of the first component 302A and thus the punched out space as defined by 304A may be regarded as a uniform offset of the boundary of the first circuit component 302A. In some embodiments, the method or system, after performing the spacetile punch for 302A, may identify a single spacetile that includes the entire routing space under consideration and excludes the space defined by 304A.

The method or system may further perform a spacetile punch for the track 308A. The details of the spacetile punch are provided below with reference to FIG. 3B. FIG. 3B illustrates the same track 308A, against which the method or system performs the spacetile punch. The method or system may perform the spacetile punch and subdivide the routing space into three spacetiles—the spacetile 306B representing a one-dimensional degenerated area with zero thickness, the spacetile 302B representing the space below the degenerated area 306B, and the spacetile 304B representing the space below the degenerated area 306B.

FIG. 3B illustrates a close-up view of 310A of FIG. 3A. It shall be noted that although the spacetile 304B and 302B are illustrated to be of some distance from the degenerated spacetile 306B, spacetile 306B in fact represents and comprises a one-dimensional, degenerated area (rather than a conventional two-dimensional area as 302B and 304B). Also, the two vertical, dashed lines for each of 302B and 304B are shown to indicate that the spacetile 302B and spacetile 304B are two-dimensional areas, and these vertical, dashed lines do not represent the actual boundaries of the spacetiles 302B and 304B. In this example, the method or system further subdivides the single spacetile after performing the spacetile punch for the first circuit component 302A into three spacetiles—one one-dimensional spacetile and two two-dimensional spacetiles.

The method or system may then use any spacetiles as area probes. Similarly, the method may perform a spacetile punch to further identify more spacetiles for a vertical track 308B. For example, the method or system may further identify a two-dimensional spacetile to the right of 308B, a two-dimensional spacetile to the left of 308B, the one-dimensional, degenerated spacetile along 308B, and a zero-dimensional, degenerated spacetile 310B that represents the intersection of the horizontal track 308A and the vertical track 308B. This example illustrates that the method or the system may then use the spacetiles to perform area search to determine how to route an electronic design by identifying one or more area probes from the spacetiles and further by using the one or more area probes for determining the route, and that a spacetile may comprise an object associated with a two-dimensional geometric space or a degenerated zero- or one-dimensional geometric entity.

Figure 4A:
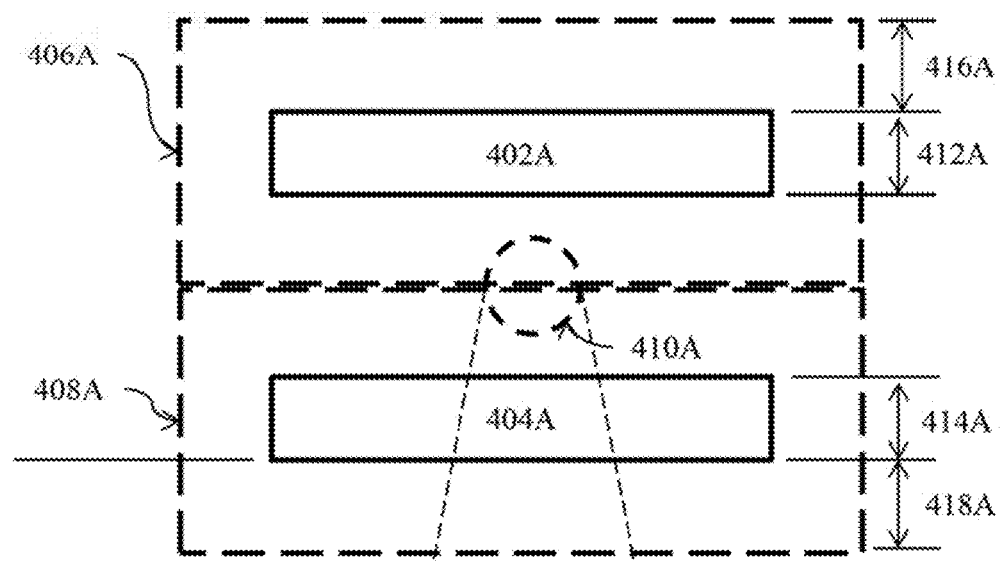
FIG. 4A illustrates another exemplary spacetile punch that generates a degenerated area probe that may be used for area search in routing an electronic design in some embodiments.
Figure 4B:
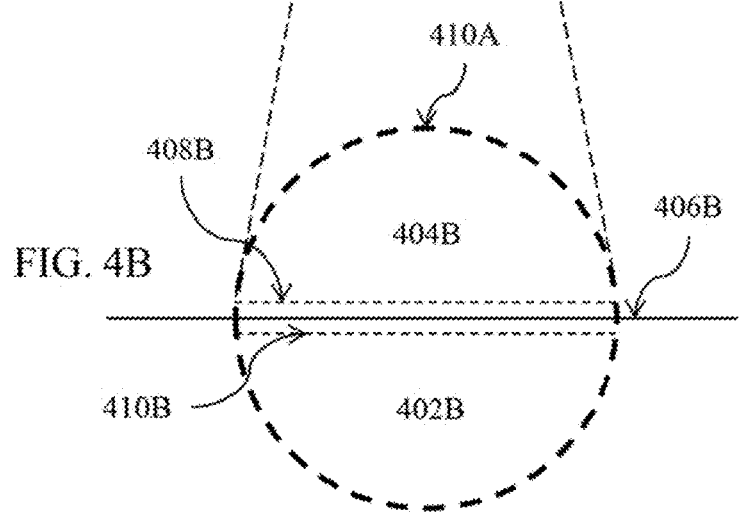
FIG. 4B illustrates more details about the spacetile punch illustrated in FIG. 4A in some embodiments.

FIG. 4A illustrates another exemplary spacetile punch that generates a degenerated area probe that may be used for area search in routing an electronic design in some embodiments. More specifically, FIG. 4A illustrates that the natural formation of a degenerated spacetile in some specific embodiments. FIG. 4A shows a routing space with the first component 402A and a second component 404A. The method or system may perform a spacetile punch for 402A and 404A respectively and punch out the space enclosed by 406A and 408A from usable routing space in a substantially similar manner as that described with reference to FIGS. 3A-B. If the placement tool determines the spacing between 402A and 404A in such a way (e.g., to minimize the use of real estate while satisfying all design rules) that the bottom of the space 406A coincides with the top of the space 408A, a viable spacetile may be determined as illustrated in FIG. 4B. For example, the distance 416A for the spacetile punch for 402A may be determined to be ((spacing between 402A and 404A)+½×width of wire) for the first component 402A. Similarly, the distance 418A for the spacetile punch for 404A may be determined to be ((spacing between 402A and 404A)+% ½×width of wire) for the second component 404A. In some embodiments where a via location is to be determined, the distance for the spacetile punch may be determined to be ((spacing requirement for a via)+½×width of via) rather than (½×width of wire).

It shall be noted that the spacing requirement may be imposed as a soft or a hard design rule in some embodiments, where a hard design rule must be followed, and the soft design rule is preferably followed unless or until no satisfactory placement or routing solution cannot be obtained. As a result, the spacing requirement may comprise as simple as a single numeric value or a multi-valued requirement or rule (e.g., maintain the minimum spacing of x1-nm between interconnects unless no solution can be obtained & maintain the minimum spacing of x2-nm between interconnects when no solution can be obtained with the minimum spacing of x1-nm). In some embodiments where complex spacing rules are required or desired, the spacing requirement may comprise, for example, a polynomial function of one or more variables. For example, there may exist one or more design rules that require the minimum spacing between interconnects to be a polynomial function (e.g., a linear or a higher-order function) of the parallel run-length between the two interconnects. The method or system may use the same methodology to determine the distance for the spacetile punch accordingly to accommodate various types of requirements, constraints, or design rules. As a result, the geometric shapes of the space as indicated by 406A and 408A may not necessarily be rectangles as illustrated in FIG. 4A, which is provided for the ease of illustration and explanation. Rather, the geometric shapes of 406A and 408A are determined based at least in part upon the shapes involved (e.g., 402A or 404A), the width of the interconnect to be determined, or the length of the interconnect to be determined.

FIG. 4B illustrates more details about the spacetile punch illustrated in FIG. 4A in some embodiments. More specifically, FIG. 4B illustrates a close-up of the area 410A in FIG. 4A. As described in the preceding paragraphs with reference to FIGS. 3A-B, the method or system may perform the spacetile punch to form three spacetiles—spacetile 404B representing the area above, spacetile 402B representing the are below, and a one-dimensional, degenerated spacetile 406B. It shall be noted that although spacetiles 404B and 402B are illustrated with a boundaries defined by line segments 408B and 410B respectively, the degenerated spacetile 406B is one-dimensional and thus is associated with zero width. In other words, 408B and 410B are illustrated in FIG. 4B to indicate the creation of three spacetiles but do not intend to imply that spacetile 406B is associated with any non-zero width values.

If the placement tool determines the spacing between 402A and 404A in such a way (e.g., to minimize the use of real estate while satisfying all design rules) that the bottom of the space 406A coincides with the top of the space 408A, a viable spacetile 406B is thus created for this particular configuration. The method or system may then use the spacetile 406B as an area probe to route the electronic circuit by searching along the area probe 406B, which is a one-dimensional line segment. It shall be noted that the other spacetiles may not be viable options for area probes because, for example, the spacetile 404B above 406B determined by the spacetile punch for the second component 404A encroaches upon the punched out space defined by 406A, and the spacetile 402B below 406B determined by the spacetile punch for the first component 402A encroaches upon the punched out space defined by 408A. In this example, the method or system may then determine to run the interconnect between 402A and 404A by placing the centerline of the interconnect within the area probe 406B—that is, right on the area probe 406B because the space probe 406B constitutes a degenerated spacetile.

Figure 5A:
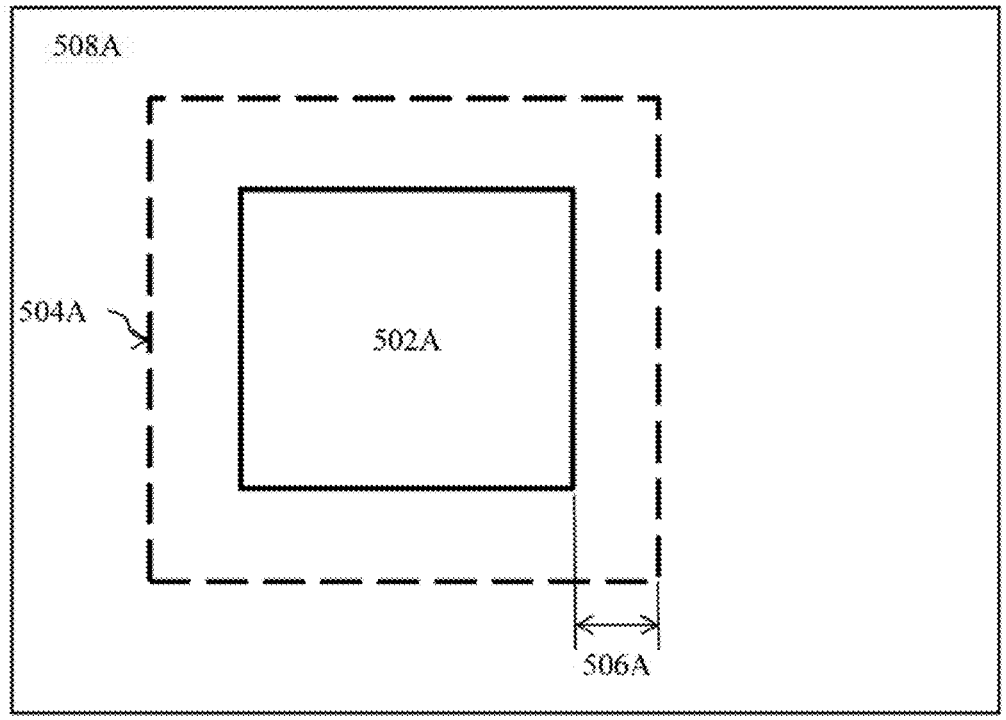
FIGS. 5A-E illustrate an exemplary approach for routing an electronic design between a tracked (or gridded) layer and a trackless layer with an intermediate via spacetile layer in some embodiments.

FIGS. 5A-E illustrate an exemplary approach for routing an electronic design between a tracked (or gridded) layer and a trackless layer with an intermediate via spacetile layer in some embodiments. More specifically, FIG. 5A illustrates a first routing layer or a portion thereof 508A on a metal layer (e.g., Metal 4 or M4) that includes a blockage or cell 502A. FIG. 5A further illustrates that routing layer 508A is trackless. The method or system may perform a spacetile punch for the blockage or cell 502A. For example, the method may determine the distance 506A for the spacetile punch to be spacing requirement plus half the wire width value.

Figure 5B:
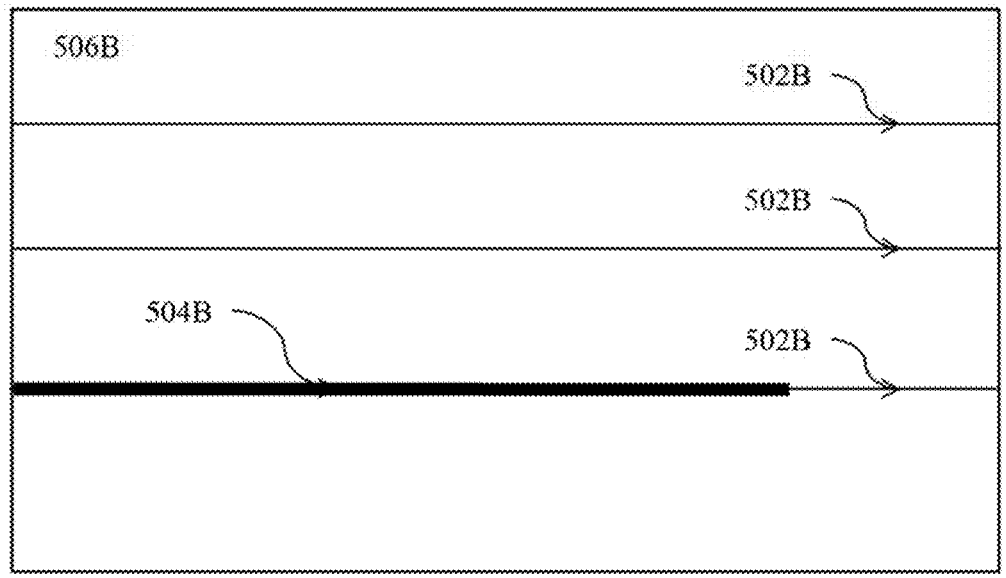
Figure 5C:
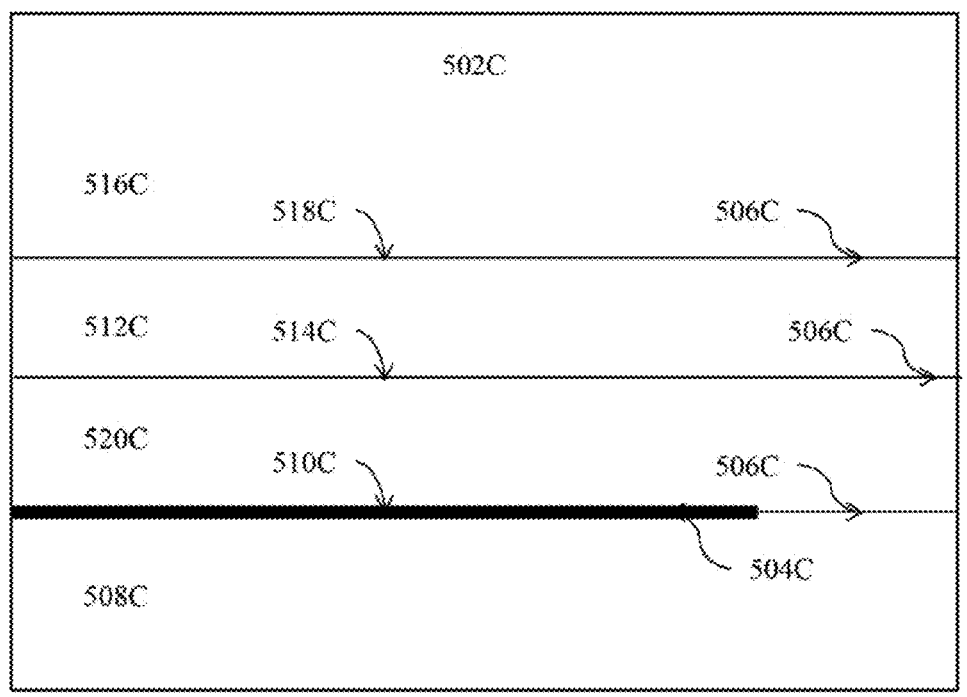

FIG. 5B illustrates a second routing layer or a portion thereof 506B (e.g., Metal 3 or M3) that includes an area probe 504B that lies along a horizontal track 502B. In other words, the routing layer or a portion thereof 506B is tracked. FIG. 5C illustrates the result of the method or system performing a spacetile punch for the second routing layer 502B. The method or system may perform the spacetile punch routing space 502C with respect to the tracks 506C (from the tracks 502B in FIG. 5B) and form the following spacetiles—spacetile 516C above 518C, degenerated spacetile 518C, spacetile 512C below 518C, degenerated spacetile 514C, spacetile 512C above 514C, degenerated spacetile 514C, spacetile 520C below 514C, degenerated spacetile 510C, and spacetile 508C below 410C. FIG. 5C also includes the area probe 504C in the second routing layer.

Figure 5D:
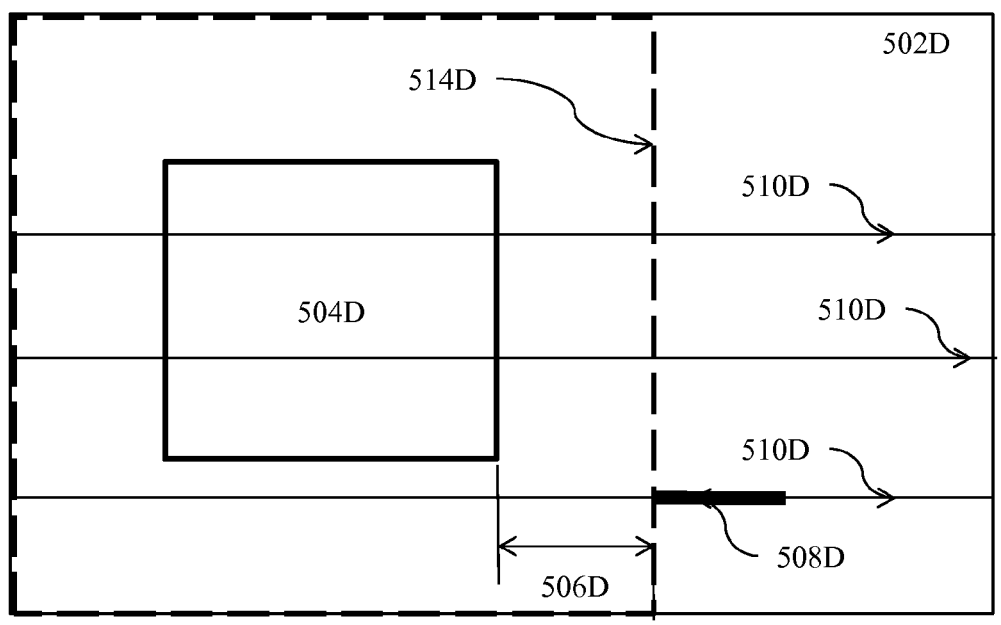
Figure 5E:
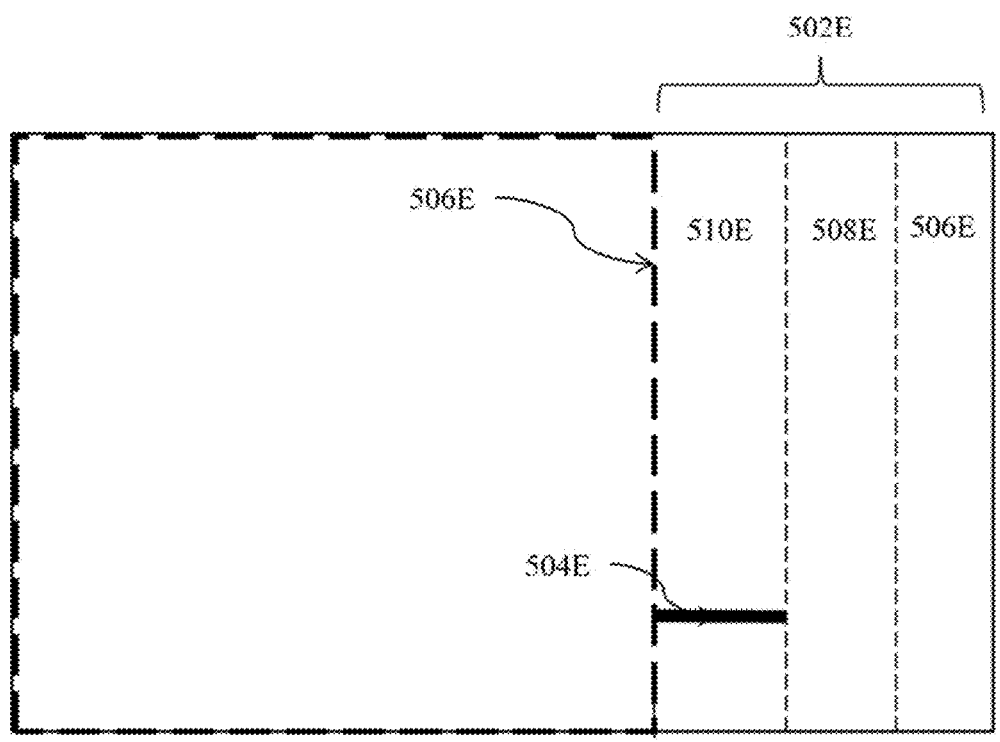

FIG. 5D illustrates an exemplary via spacetile layer 502D that aggregates the elements of both the first routing layer 508A and the second routing layer 506B. For example, FIG. 5D includes the blockage or cell 504D. The method or system performs the spacetile punch with respect to the blockage or cell 504D in a similar manner as that described for FIG. 5A and punches out the space enclosed by the dashed rectangle 514D based on the punch distance 506D, which may be determined in a substantially similar manner as that described above. It shall be noted that the left-hand portion of the via spacetile layer 502D is assumed to be punched out by the spacetile punch process for simplicity.

FIG. 5D further includes the horizontal tracks 510D that are inherited from the horizontal tracks 502B of FIG. 5B. FIG. 5D also includes the spacetiles determined from both FIG. 5A and FIG. 5C as well as the area probe 508D inherited from the second routing layer. Moreover, the method or system may then perform the aggregation process to take the intersection between the spacetiles determined from FIG. 5A and FIG. 5C and the area probe 508D (inherited from 504C in FIG. 5C). Because the space enclosed by 514D has been punched out by the spacetile punch with respect to the blockage or cell 504D, it can be derived that the resulting area probe 508D is shortened because of the removal of usable routing area due to the spacetile punch.

In this example illustrated by FIGS. 5A-D, the method or system may then route the electronic design on the second routing layer 506B by using the area probe 504B and then transition via a via spacetile layer illustrated in FIG. 5D to the first routing layer 502A and continue to route the electronic circuit on the first routing layer 502A by using the resulting probe 508D as shown in FIG. 5D. In some embodiments, the method or system may further sub-divide the available routing space (as shown by 502E in FIG. 5E) into multiple smaller spacetiles to further guide or narrow the search. For example, 506E in FIG. 5E indicates the space that has been punched out due to the spacetile punch with respect to the blockage or cell 502A, and the remaining routing space 502E indicates the usable routing space. The method or the system may then sub-divide the routing space into three smaller spacetiles and identify a smaller spacetile to continue the search for a viable routing solution. In this example, the method or system sub-divides the remaining routing space 502E into 510E based on the end points of the resulting area probe 504E and forms two more smaller spacetiles 508E and 506E by further sub-division.

Figures 1, 6A:
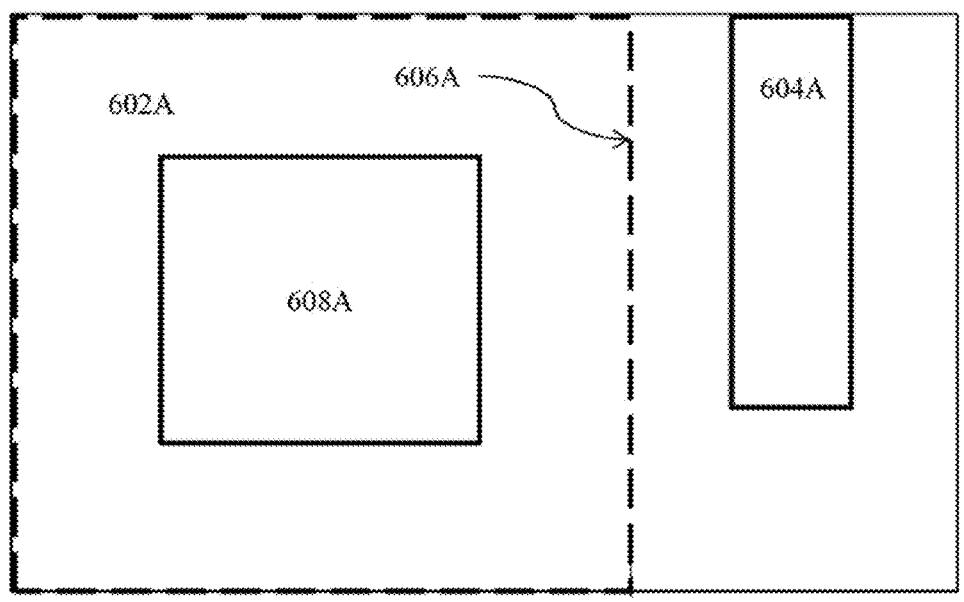
FIGS. 6A-C illustrate an exemplary approach for routing an electronic design by using spacetiles between a tracked (or gridded) layer and a trackless layer with an intermediate via spacetile layer in some embodiments.
Figures 2, 6A:
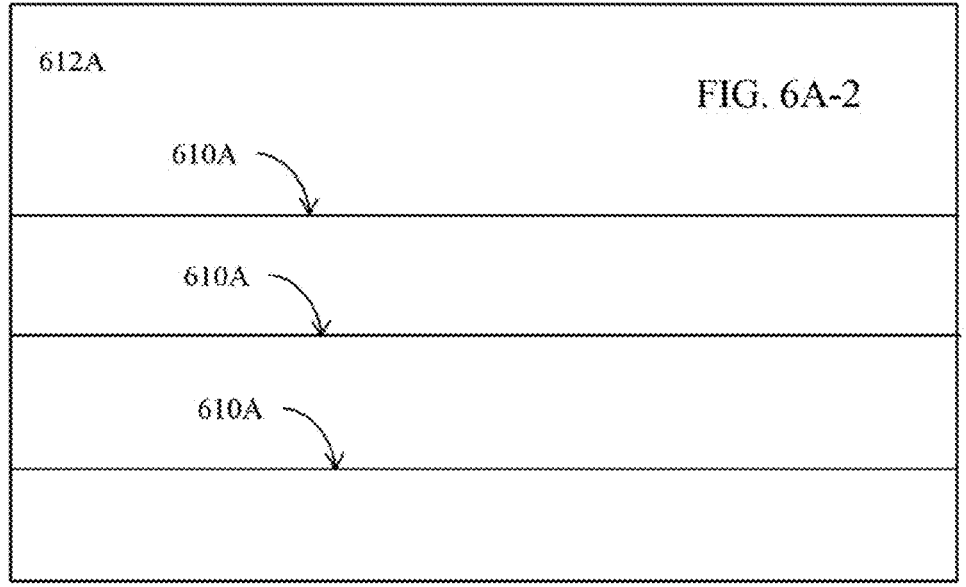
Figure 6B:
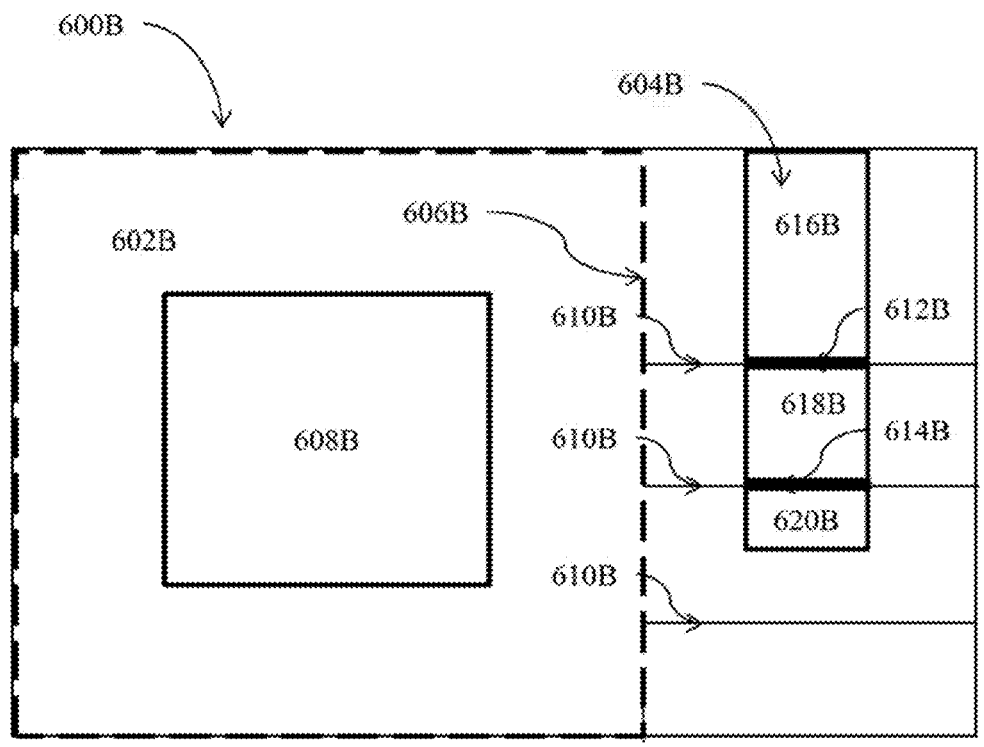
Figure 6C:
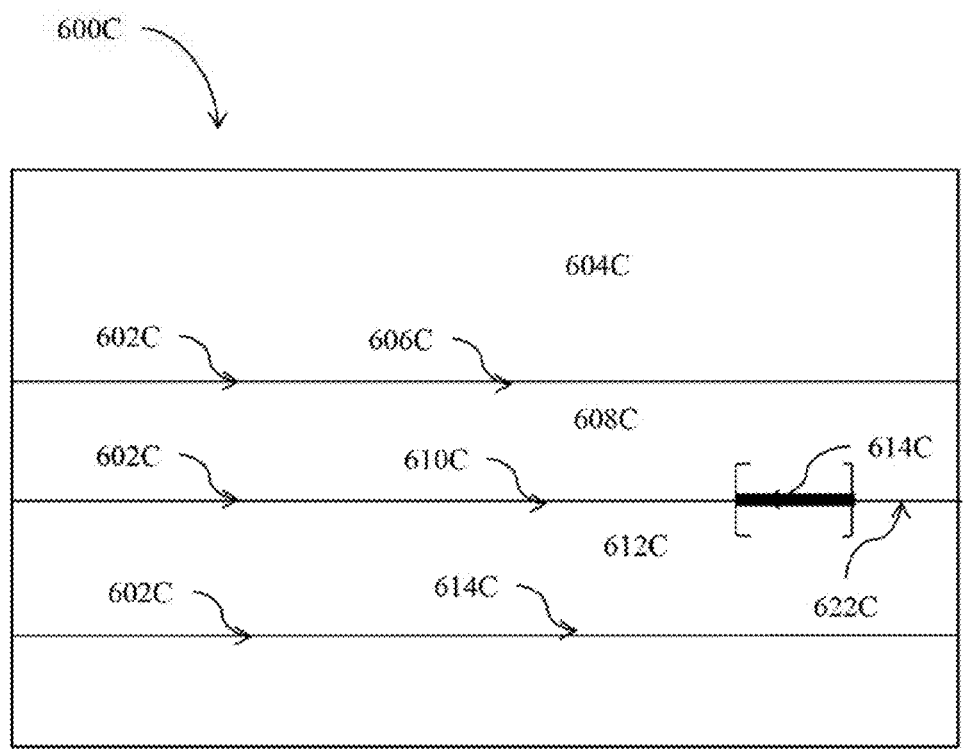

FIGS. 6A-C illustrate an exemplary approach for routing an electronic design by using spacetiles between a tracked (or gridded) layer and a trackless layer with an intermediate via spacetile layer in some embodiments. More specifically, FIG. 6A-1 illustrates a first routing layer 600A including a blockage, cell, or macro 608A and an area probe 604A. The method or system may perform a spacetile punch to punch out the space 602A enclosed by the boundaries 606A in a substantially similar manner as that described for FIGS. 3A-B or FIGS. 5A-E above.

As it can be seen from FIG. 6A-1, routing layer 600A is associated with no tracks and is thus trackless and gridless. FIG. 6A-2 illustrates a second routing layer 612A associated with three horizontal tracks 610A near the bottom portion of the second routing layer 612A. In other words, the second routing layer 612A is tracked, although gridless due to the absence of grids. The method or system may further perform a spacetile punch for the second routing layer 612A to determine three degenerated spacetiles on the tracks 610A and four two-dimensional spacetiles on either side of the degenerated spacetiles on the tracks 610A. FIG. 6B illustrates a via spacetile layer according to some embodiments. More specifically, the method or system determines the via spacetile layer 600B by first aggregating the features of both the first routing layer 602A and the second routing layer 612A.

For example, the via spacetile layer 600B may include the blockage, cell, or macro 608B, the punched out space 602B as defined by the boundaries 606B, the area probe 604B (inherited from 604A), three degenerated spacetiles 610B (inherited from FIG. 6A-2), and the tracks (from FIG. 6A-2). The method or system may further perform a spacetile punch for the area probe 604B based on the tracks inherited from FIG. 6A-2 and form the two-dimensional spacetiles 616B, 618B, and 620B, and the degenerated spacetiles 612B and 614B. The method or system may then determine the intersection of the existing area probe 604B from the first routing layer with the additional spacetiles introduced by the second routing layer 612A. In this example, the intersection includes the spacetiles 616B, 618B, and 620B as well as the degenerated spacetiles 612B and 614B.

In this example illustrated in FIG. 6B, it may be further assumed that the method or system also imposes an on-track constraint that requires an area probe to coincide with a track in some embodiments. In these embodiments, spacetiles 616B, 618B, and 620B do not meet the on-track constraint, and thus the intersection will include only the degenerated spacetiles 612B and 614B. In some embodiments, the method or system may further choose among multiple spacetiles to identify the area probe for the search for viable routing solutions. For example, the method or the system may choose among the multiple spacetiles (e.g., 612B and 614B in this example) by considering the cost associated with each of the multiple spacetiles. One factor that the method or system may consider in determining a cost to be associated with a spacetile is the distance or the predicted distance of the route to destination node if the spacetile is chosen as the area probe for the search.

FIG. 6C illustrates routing the electronic design by using spacetiles for area search while transitioning from the first routing layer 600A to the second routing layer 600C. FIG. 6C illustrates the second routing layer 600C including three horizontal tracks 602C. The method or system may perform a spacetile punch for the second routing layer 600C to form spacetiles 604C, 608C, and 612C, as well as degenerated spacetiles 606C, 610C, and 614C that coincide with the horizontal tracks 602C. In this example, it may be assumed that the method or system identifies spacetile 614B in FIG. 6B as the area probe. The method or the system may then determine the intersection between the identified spacetile 614C (inherited from 614B in the via spacetile layer as illustrated in FIG. 6B) and the spacetiles determined on the second routing layer 600C. Because it is assumed that the method or system identifies spacetile 614B as the area probe for the search, the intersection between 614C and the spacetiles (604C, 606C, 608C, 610C, 612C, and 614C) includes the spacetile 614C. As a result, the method or system, when transitioning to the second routing layer 600C (or 612A in FIG. 6A-2), may use the area probe 614C, on which the center line of an interconnect may lie, to search for viable routing solutions on the second routing layer 600C.

In some embodiments, the method or system is aware that the identified area probe (e.g., 614C) is of limited length and may then extend the area probe based on one or more properties of the second routing layer 600C. For example, the method or the system may extend the area probe 614C to form another area probe 622C on the second routing layer 600C based at least in part upon, for example, a route segment on the second routing layer 600C, and continue the search for viable routing solution by using the area probe 622C in some embodiments. Moreover, the method or system has already determined that a via may be inserted at a location along the spacetile 614C in these embodiments. The example illustrated in FIGS. 6A-C show an approach for routing an electronic circuit using spacetiles while transitioning from a trackless layer to a tracked but gridless layer.

Figure 7:
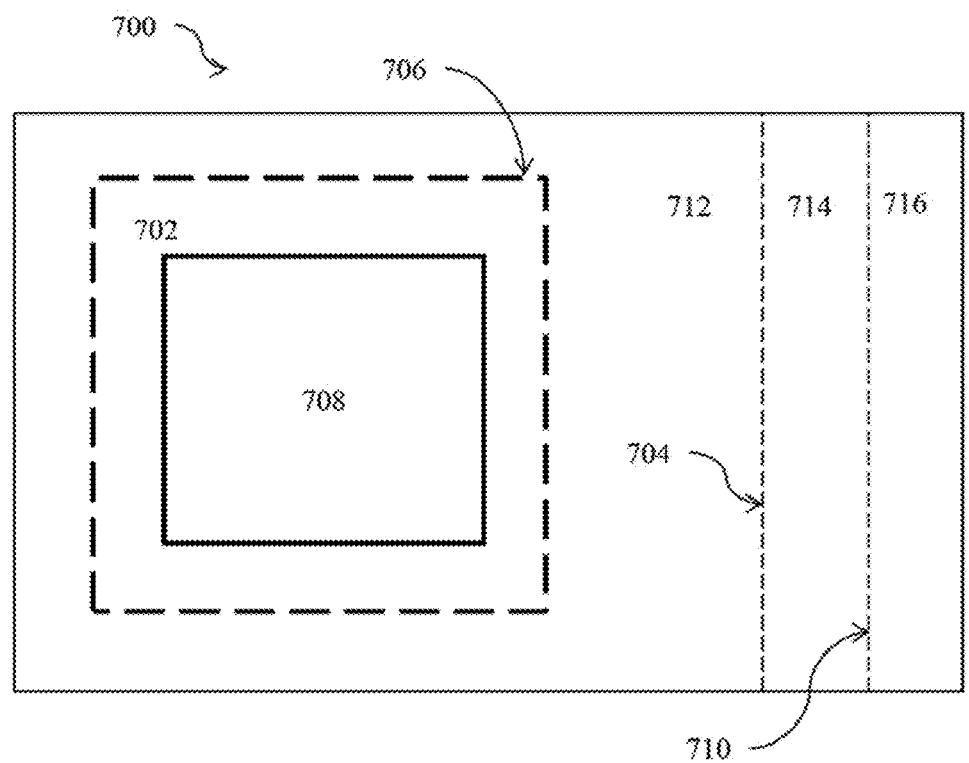
FIG. 7 illustrates an example of routing a portion of a layer that includes a tracked region with hard or soft tracks in some embodiments.

FIG. 7 illustrates an example of routing a portion of a layer that includes a tracked region with hard or soft tracks in some embodiments. More specifically, FIG. 7 illustrates a routing space 700 that includes a blockage, cell, or macro 708. The routing space may be associated with some vertical tracks 704 and 710, which may be hard tracks or soft tracks. A hard track is enforced by one or more design rules that require an interconnect to stay on a track and prohibit any off-track interconnects. A soft track may be enforced by one or more design rules that require an interconnect to stay on a track to the extent possible and may allow some off-track interconnects if the on-track requirements cannot be successfully enforced without increasing, for example, the cost, difficulty, etc. beyond some permissible thresholds or without causing other violations of, for example, one or more design rules.

FIG. 7 further shows that the left-hand portion of the routing space 700 is trackless, while the right-hand portion is tracked. The method or system may perform a spacetile punch to punch out the area 702 enclosed by the boundaries 706. Boundaries 706 may be determined by first determining the distance for the spacetile punch for 708. For example, the distance for the spacetile punch may be the spacing requirement plus half the wire width (or via diameter, etc.) and need not be constant. The method or system may further form more spacetiles by performing a spacetile punch with respect to each of the two vertical tracks. In this example, the method or system may form the additional spacetiles 712, 714, and 716, as well as the degenerated spacetiles coincident with the vertical tracks 704 and 710. The method or system may then follow similar approaches for routing the electronic circuit design in this routing layer while transition a tracked area to a trackless area, or vice versa.

Figure 8A:
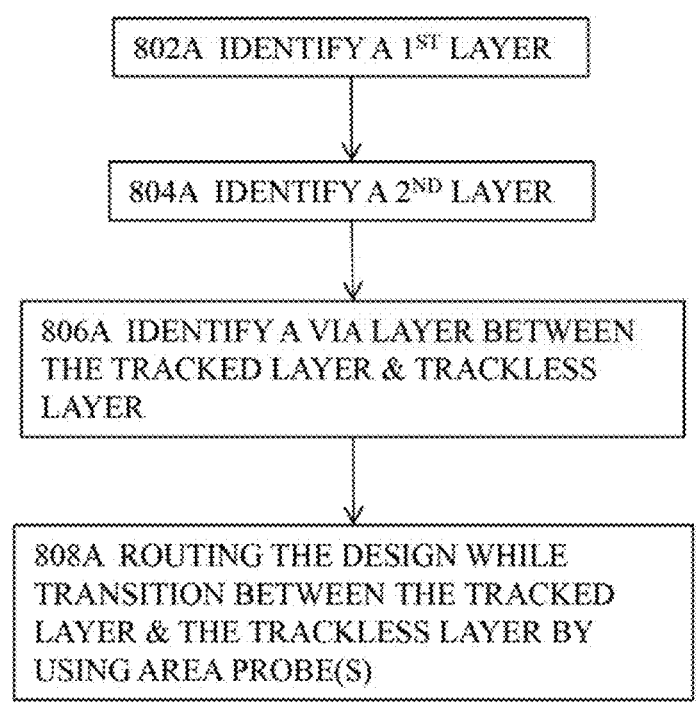
FIG. 8A illustrates a high level flow diagram for routing an electronic design using spacetiles while transitioning between a tracked or gridded layer and a trackless layer in some embodiments.

FIG. 8A illustrates a high level flow diagram for routing an electronic design using spacetiles while transitioning between a tracked or gridded layer and a trackless layer in some embodiments. In one or more embodiments, the method or system for routing an electronic design using spacetiles while transitioning between a tracked or gridded layer and a trackless layer may comprise the respective process or hardware module 802A for identifying a first layer and the respective process or hardware module 804A for identifying a second layer. In some embodiments, one of the first layer and the second layer comprises a tracked routing layer, and the other routing layer comprises a trackless routing layer.

In some embodiments, the method or system for routing an electronic design using spacetiles while transitioning between a tracked or gridded layer and a trackless layer may comprise the respective process or hardware module 806A for identifying a via layer between the first layer and the second layer. In some embodiments, the method or system for routing an electronic design using spacetiles while transitioning between a tracked or gridded layer and a trackless layer may comprise the respective process or hardware module 808A for routing the electronic circuit by using spacetiles while transitioning between the first routing layer and the second routing layer. In these examples illustrated in FIG. 8A, the method or system routes the electronic design by using spacetiles while transitioning between a tracked routing layer and a trackless routing layer.

Figure 8B:
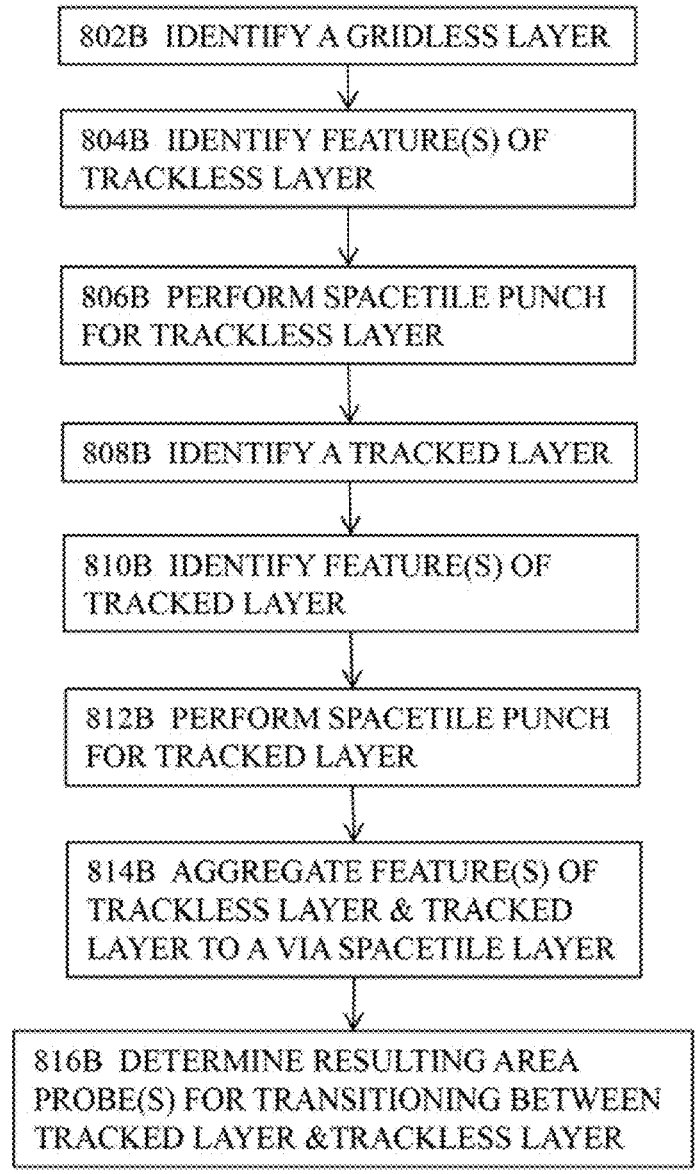
FIG. 8B illustrates more details of the high level flow diagram for routing an electronic design using spacetiles while transitioning between a tracked or gridded layer and a trackless layer illustrated in FIG. 8A in some embodiments.

FIG. 8B illustrates more details of the high level flow diagram for routing an electronic design using spacetiles while transitioning between a tracked or gridded layer and a trackless layer illustrated in FIG. 8A in some embodiments. In one or more embodiments, the method or system for routing an electronic design using spacetiles while transitioning between a tracked or gridded layer and a trackless layer comprises the respective process or hardware module 802B for identifying a first layer and the respective process or hardware module 808B for identifying a second routing layer. In these embodiments, one of the first routing layer and the second routing layer comprises a tracked routing layer, and the other comprises a trackless routing layer. In some embodiments, the method or system for routing an electronic design using spacetiles while transitioning between a tracked or gridded layer and a trackless layer comprises the respective process or hardware module 804B for identifying one or more features of the first routing layer.

In some embodiments, the one or more features of the first routing layer comprises a soft or hard track, a blockage, a via, an existing circuit component, a spacetile, or an area probe, or a combination thereof associated with the first routing layer. In some embodiments, the method or system for routing an electronic design using spacetiles while transitioning between a tracked or gridded layer and a trackless layer comprises the respective process or hardware module 806B for performing one or more spacetile punches for the first routing layer to form one or more n-dimensional spacetiles, where n={0, 1, 2}. In some embodiments, the method or system for routing an electronic design using spacetiles while transitioning between a tracked or gridded layer and a trackless layer comprises the respective process or hardware module 810B for identifying one or more features of the second routing layer. In some embodiments, the one or more features of the first routing layer comprises a soft or hard track, a blockage, a via, an existing circuit component, a spacetile, or an area probe, or a combination thereof associated with the second routing layer.

In some embodiments, the method or system for routing an electronic design using spacetiles while transitioning between a tracked or gridded layer and a trackless layer comprises the respective process or hardware module 812B for performing one or more spacetile punches for the second routing layer with respect to the tracks (if any), circuit components, etc. in the second routing layer. In some embodiments, the method or system may further comprise the respective process or hardware module 814B for identifying or determining a via spacetile layer for the first routing layer and the second routing layer by aggregating the one or more features identified for both the first and the second routing layers into the via spacetile layers. More details about the via spacetile layer will be described in subsequent paragraphs with reference to FIG. 8D.

In some embodiments, the method or system may further comprise the respective process or hardware module 816B for determining one or more resulting area probes for routing the electronic design while transitioning between the first and the second routing layers. In some embodiments, the method or the system may determine or identify the one or more area probes from the resulting spacetiles in the via spacetile layer and further by manipulating the resulting spacetiles with the tracks (if any), spacetiles, or other factors such as costs, constraints, design rules, etc. in the routing layer the method or system is transitioning into. In the embodiments illustrated in FIG. 8B, the method or system routes the electronic circuit design between a tracked routing layer and a trackless routing layer by using one or more area probes for performing area search for viable routing solutions.

Figure 8C:
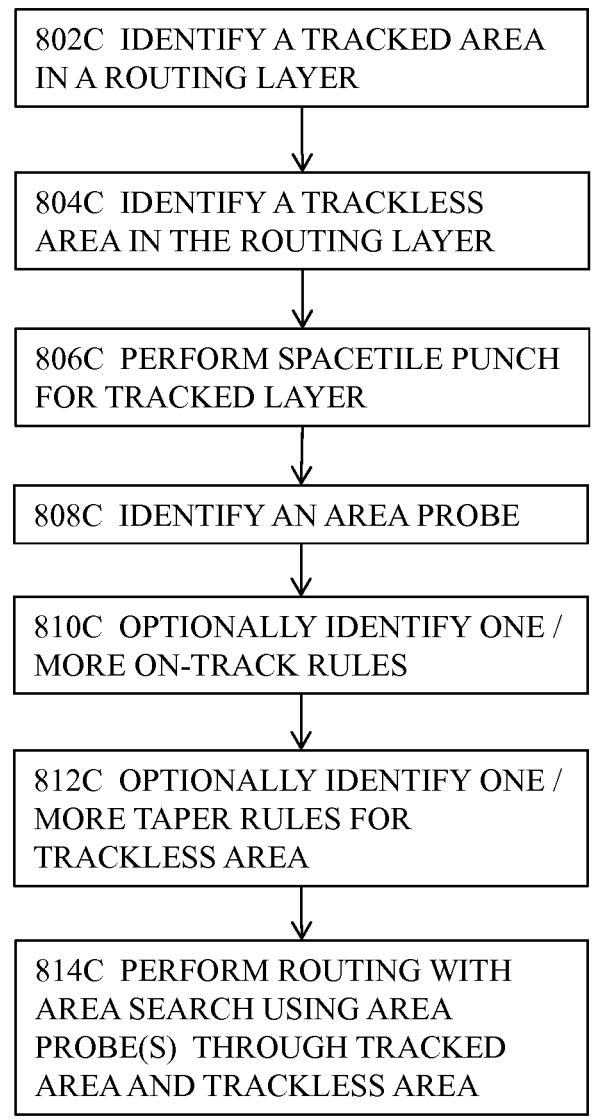
FIG. 8C illustrates more details of the high level flow diagram for routing an electronic design using spacetiles while transitioning between a tracked or gridded region of a routing layer and a trackless region of the layer in some embodiments.

FIG. 8C illustrates more details of the high level flow diagram for routing an electronic design using spacetiles while transitioning between a tracked or gridded region of a routing layer and a trackless region of the layer in some embodiments. In some embodiments, the method or system may further comprise the respective process or hardware module 802C for identifying a first area in a routing layer and the respective process or hardware module 804C for identifying a second area in the same routing layer. In some embodiments, one of the first area and the second area comprises a tracked area, and the other comprises a trackless area. In some embodiments, the first area and the second area jointly constitute the entire routing layer. In some embodiments, the first area and the second area, when taken together, constitute a smaller portion of the entire routing area.

The embodiments illustrated in FIG. 8C describe an approach where a method or system routes at least a portion of the routing layer by using one or more area probes to perform area search for viable routing options while transitioning between a tracked in one area of a routing layer to another trackless area of the same routing layer. In some embodiments, the method or system may further comprise the respective process or hardware module 806C for performing one or more spacetile punches for the first area based on the existing circuit component(s) and track(s) (if any) in the first area to determine one or more spacetiles. In some embodiments, the method or system may further comprise the respective process or hardware module 808C for identifying one or more area probe from the one or more spacetiles identified or formed at 806C.

For example, the method or system may identify the one or more area probes from the one or more identified spacetiles based at least in part upon the cost associated with at least some of the spacetiles, the exact or approximate distance between a spacetile and the destination, or the existence or non-existence of any on-track constraints or design rules that require the centerline of an interconnect coincide with a track, etc., or a combination thereof. In some embodiments, the method or system may further optionally comprise the respective process or hardware module 810C for identifying one or more on-track design rules or constraints that may require the centerline of an interconnect coincide with a track. In some embodiments, the method or system may further determine whether the on-track design rules, constraints, requirements, or properties (hereinafter on-track requirement or on-track requirements) apply to the entire net, the entire routing area (e.g., the first routing area or the second routing area), the entire routing layer, the entire design, or merely apply to a limited region with a predetermined size.

In some embodiments, the method or system may further comprise the respective process or hardware module 812C for identifying one or more taper rules for a trackless routing area. In some embodiments, a taper rule comprises a relaxed design rule with respect to another, more strict design rule. For example, if there exists an on-track requirement a net is to be routed with a first requirement including an on-track requirement, the method or the system may determine a taper rule for the first requirement and attach the taper rule to a certain portion of the net (e.g., to the pins or terminals, or to a portion of the net within a certain distance, etc.), where the taper rule may allow the router to use a less restrictive rule if the router cannot successfully route the net or cannot optimally route the net with the more restrictive rule in a certain area.

For example, the method or the system may escape from the more restrictive rule within the predetermined short distance to proceed with the less restrictive, taper rule. In some other embodiments, the method or system may associate each spacetile with a cost measure, and, where there exists an on-track requirement, associate a higher cost with an off-track spacetile. The method or the system may then identify the lowest cost spacetile as the area probe and continue the area search with the area probe for viable routing solutions in these latter embodiments.

Figure 8D:
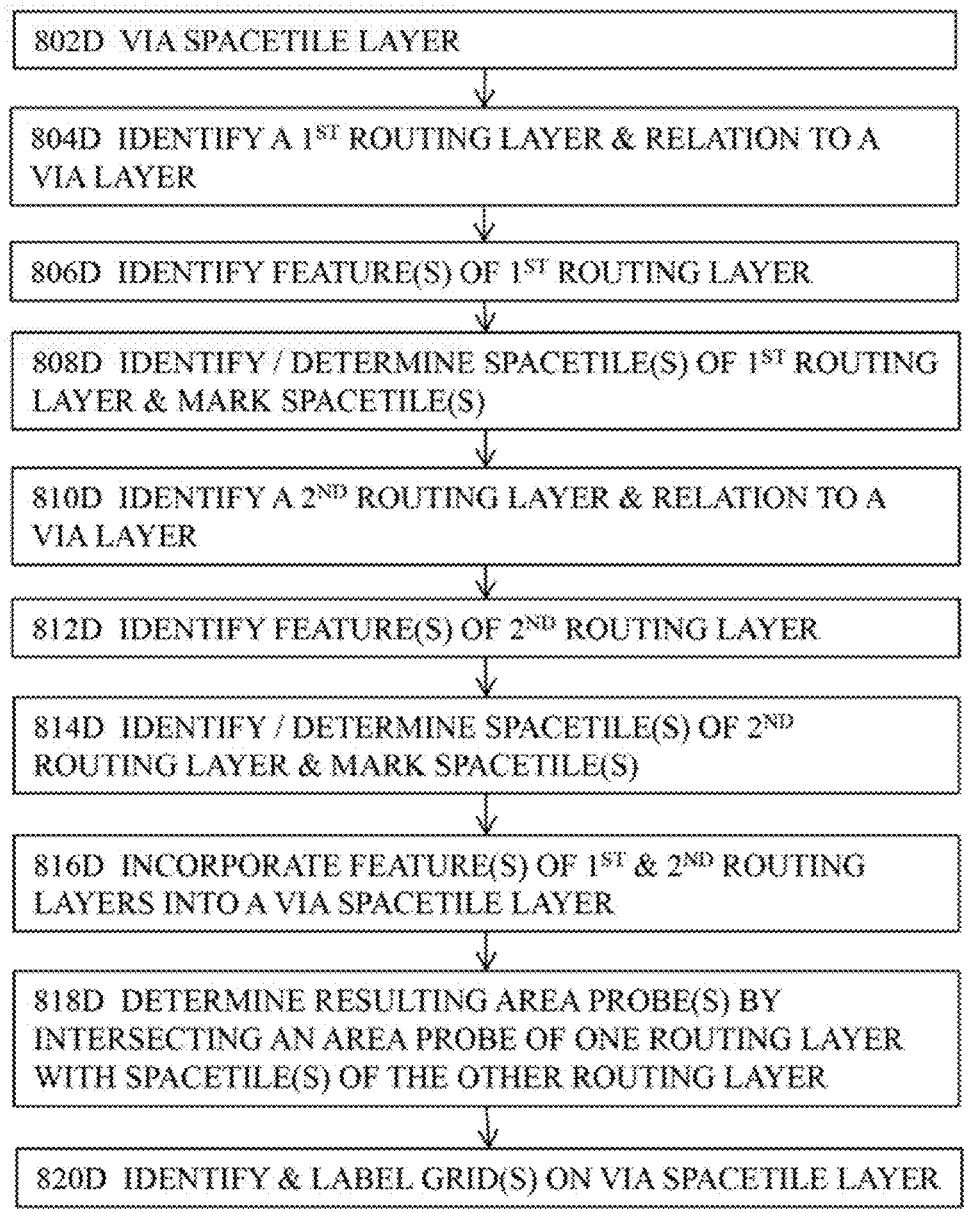
FIG. 8D illustrates more details of the high level flow diagram for routing an electronic design using spacetiles while transitioning between a tracked or gridded layer and a trackless layer by using a via spacetile layer in some embodiments.

FIG. 8D illustrates more details of the high level flow diagram for routing an electronic design using spacetiles while transitioning between a tracked or gridded layer and a trackless layer by using a via spacetile layer in some embodiments. More specifically, FIG. 8D illustrates a high level flow diagram for identifying, determining, or creating a via spacetile layer for a via layer between two routing layers. In one or more embodiments, the process or module 802D for identifying, determining, or creating a via spacetile layer may comprise the respective process or hardware module 804D for identifying a first routing layer and its relation to a via layer. In some embodiments, the process or module 802D for identifying, determining, or creating a via spacetile layer may comprise the respective process or hardware module 806D for identifying one or more features of the first routing layer.

In some embodiments, the one or more features comprise a circuit component, a track (if any), a spacetile, an area probe, a cell, a blockage, or a macro, etc., or a combination thereof. In some embodiments, the process or module 802D for identifying, determining, or creating a via spacetile layer may comprise the respective process or hardware module 808D for identifying or determining one or more spacetiles for the first routing layer by performing one or more spacetile punches for the first routing layer with respect to at least some of the one or more features identified at 806D. In some embodiments, the method or the system may further mark or label the one or more spacetiles with their respective markings.

In some embodiments, the marking "on track" indicates a spacetile coincides with a track; the marking "off track" indicates that a spacetile does not coincide with a track; the marking "lower on track" indicates that a spacetile is on track and corresponds to the routing layer underneath the via layer for which the via spacetile layer is identified, determined, or created; the marking "lower off track" indicates that a spacetile is not on track and corresponds to the routing layer underneath the via layer for which the via spacetile layer is identified, determined, or created; the marking "upper on track" indicates that a spacetile is on track and corresponds to the routing layer above the via layer for which the via spacetile layer is identified, determined, or created; the marking "upper off track" indicates that a spacetile is not on track and corresponds to the routing layer above the via layer for which the via spacetile layer is identified, determined, or created; and the marking 18 "cut on track" indicates where a single cut via may be located.

Although the aforementioned examples include textual markings, the spacetiles need not be marked or labeled as such in some embodiments. In fact, the method or system may use other symbolic, graphical, or numeric markings to label the spacetiles to achieve the same, intended purposes in some other embodiments. Also, the method or system may label the spacetiles with respective markings that correspond to different costs to aid the determination and identification of area probes or viable routing solutions. In some embodiments, the process or module 802D for identifying, determining, or creating a via spacetile layer may comprise the respective process or hardware module 810D for identifying a second routing layer and its relation to the via layer. In some embodiments, the process or module 802D for identifying, determining, or creating a via spacetile layer may comprise the respective process or hardware module 812D for identifying one or more features for the second routing layer in a substantially manner as that described for 806D.

In some embodiments, the process or module 802D for identifying, determining, or creating a via spacetile layer may comprise the respective process or hardware module 814D for identifying or determining one or more spacetiles for the second routing layer and optionally for marking or labeling the one or more spacetiles with their respective markings in a substantially manner as that described for 810D. In some embodiments, the process or module 802D for identifying, determining, or creating a via spacetile layer may comprise the respective process or hardware module 816D for incorporating at least some of the one or more features identified for the first routing layer at 806D and at least some of the one or more features identified for the second routing layer at 812D into a via spacetile layer. In some embodiments, a via spacetile layer is created in a volatile memory for an intermediate solution for transitioning between the first routing layer and the second routing layer via the via lay, where the results of the area probes and spacetiles determined or identified for the via spacetile layer are populated to the corresponding transition-to routing layer for performing area search with the one or more area probes to determine viable routing solutions.

In some embodiments, the process or module 802D for identifying, determining, or creating a via spacetile layer may comprise the respective process or hardware module 818D for determining one or more resulting area probes by intersecting one or more existing area probes with one or more spacetiles. In some embodiments, the one or more area probes may be determined by taking one or more factors into account. The one or more factors may include, for example but not limited to, the existence of on-track requirements, cost associated with the corresponding spacetile, the exact or relative distance to the destination by using a specific spacetile, the existence of hard tracks, whether soft tracks are permitted, etc.

In some embodiments, the process or module 802D for identifying, determining, or creating a via spacetile layer may optionally comprise the respective process or hardware module 820D for identifying a separate set of grids on the via spacetile layer. In some embodiments where both the upper routing layer and the lower routing layer are tracked, the method or system may imply a set of via grids by using the degenerated spacetiles determined by performing one or more spacetile punches for the tracks on both the upper routing layer and the lower routing layer. In some embodiments, a via spacetile layer may nonetheless include its own set of grids where each of the grids represents a possible location to place a single cut via. In some embodiments, the method or system may further mark or label the grids as "cut on track".

Figure 9A:
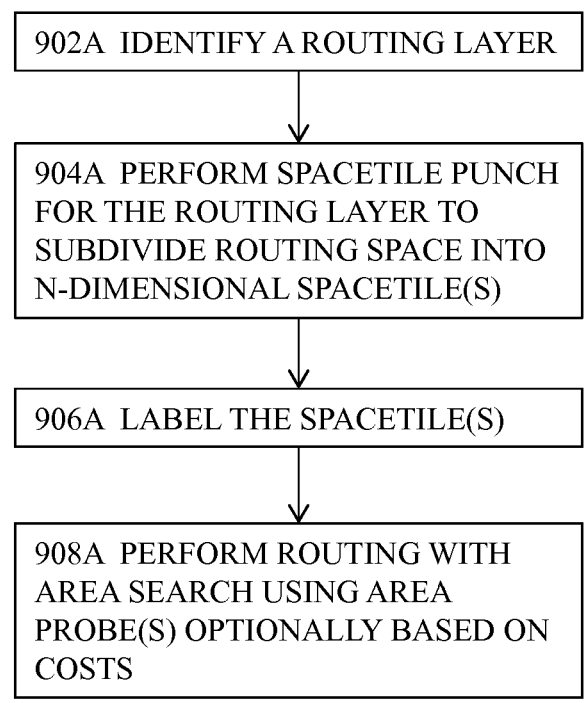
FIG. 9A illustrates a high level flow diagram for routing an electronic design using spacetiles by using spacetiles in some embodiments.

FIG. 9A illustrates a high level flow diagram for routing an electronic design using spacetiles by using spacetiles in some embodiments. More specifically, the embodiments illustrated by FIGS. 9A-B encompass the approach for routing an electronic design by using spacetiles. In one or more embodiments, the method or system for routing an electronic design using spacetiles by using spacetiles comprises the respective process or hardware module 902A for identifying a routing layer. In some embodiments, the method or system for routing an electronic design using spacetiles by using spacetiles comprises the respective process or hardware module 904A for performing one or more spacetile punches for the routing layer to form one or more spacetiles.

In various embodiments, a spacetile comprises a zero-, one-, or two-dimensional geometric entity in the routing space within, along, or at which the centerline of an interconnect or a center of a circuit feature (e.g., a via) may lie. A spacetile may be used as an area probe by the method or system to search for viable routing solutions. Regardless of the dimensionality of a spacetile, a space tile is considered an area probe, whereas the zero- and one-dimensional spacetiles are considered degenerated area probes. In some embodiments, the method or system for routing an electronic design using spacetiles by using spacetiles comprises the respective process or hardware module 906A for marking or labeling the spacetiles with their respective markings. In addition to the markings described in the preceding paragraphs, the method or system may further mark some of the spacetiles with different colors or mark the spacetiles for routing the same net with the same color and use a different color for the spacetiles for a different net. In some embodiments, the method or system for routing an electronic design using spacetiles by using spacetiles comprises the respective process or hardware module 908A for routing the electronic design using the spacetile to search for viable routing solutions.

Figure 9B:
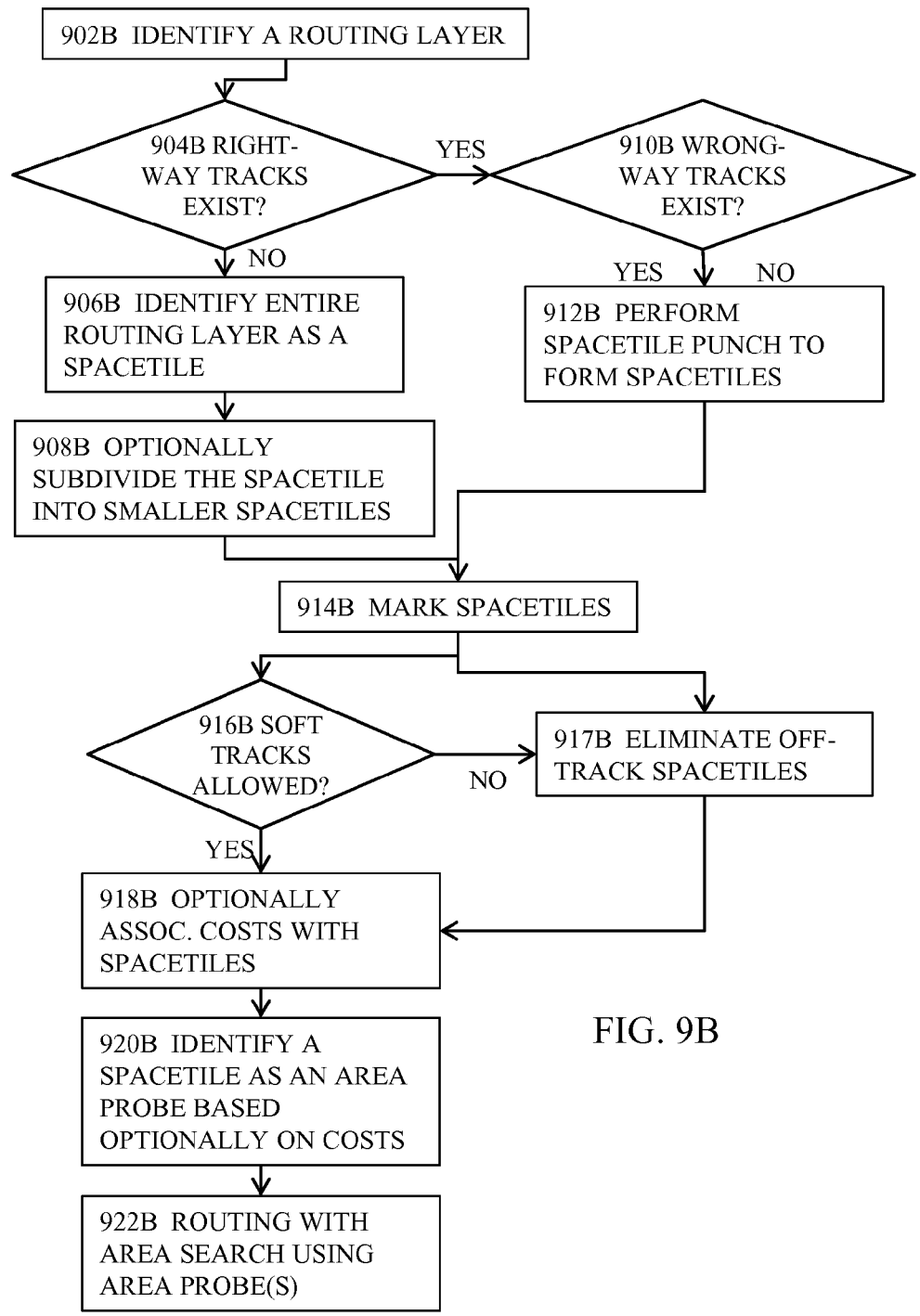
FIG. 9B illustrates more details of the high level flow diagram for routing an electronic design using spacetiles by using spacetiles illustrated in FIG. 9A in some embodiments.

FIG. 9B illustrates more details of the high level flow diagram for routing an electronic design using spacetiles by using spacetiles illustrated in FIG. 9A in some embodiments. In some embodiments, the method or system for routing an electronic design using spacetiles by using spacetiles comprises the respective process or hardware module 902B for identifying a routing layer. In some embodiments, the method or system for routing an electronic design using spacetiles by using spacetiles comprises the respective process or hardware module 904B for determining whether there exists one or more right-way tracks. If the method or system determines that there does not exist any right-way track at 904B (e.g., the routing layer is trackless), the method or system may further comprise the respective process or hardware module 906B for identifying the entire routing layer as a single spacetile, subject to the spacetile punch process that may punch out certain part of the routing space from the usable routing space.

It shall be noted that in most cases, if a routing layer is to include tracks in only one direction, such tracks will be running along the preferred or default routing direction and thus constitute right-way tracks although various embodiments described herein apply with full, equal force to a routing space that contains only the wrong-way tracks. In these embodiments, the method or system may further optionally comprise the process or hardware module 908B for subdividing the single spacetile into multiple smaller spacetiles. The method may then proceed to 914B. In some embodiments where the method or system determines that there do exist one or more right-way tracks in the routing layer at 904B, the method or system may further respectively comprise the process or hardware module 910B for determining whether there exist one or more wrong-way tracks in the routing layer.

If the routing layer further includes one or more wrong-way tracks, the routing layer may be considered gridded. On the other hand, if the routing layer does not include any wrong-way tracks, the routing layer may be considered tracked but gridless because of the absence of the wrong-way tracks to define the grids. Regardless of the existence of wrong-way tracks, the method or the system applies various approaches with full and equal force. In other words, various embodiments described herein do not require any wrong-way tracks to achieve the disclosed intended purposes. In some embodiments, the method or system for routing an electronic design using spacetiles by using spacetiles comprises the respective process or hardware module 912B for performing one or more spacetile punches for the routing space to form multiple spacetiles by using one or more punch distances as described above.

If the routing layer includes one or more wrong-way tracks, the method or system may perform one or more spacetile punches to form zero-, one-, or two-dimensional spacetiles. On the other hand, if the routing layer does not include any wrong-way tracks, the method or system may perform the one or more spacetile punches to for one- or two-dimensional spacetiles. The method or system may then proceed to 914B. In some embodiments, the method or system for routing an electronic design using spacetiles by using spacetiles comprises the respective process or hardware module 914B for marking or labeling the spacetile(s). In some embodiments, the method or system for routing an electronic design using spacetiles by using spacetiles comprises the respective process or hardware module 916B for determining whether soft tracks are permitted in the routing layer or in the electronic design.

In some embodiments where soft tracks are permitted, the method or system may further determine whether a distance or a portion of the design within which soft tracks may be used. For example, in some areas where the method or system may determine that strictly enforcing the on-track requirement may not lead to successful routing solution or may increase cost of the routing solution beyond some threshold, the method or system may use off-track spacetiles to perform area search for other viable routing solutions within some pre-determined distance or within some predefined region. In these embodiments, the method or system may switch back to the on-track requirement outside the predetermined distance or region. In some embodiments where soft tracks are not permitted, the method or system may further respectively comprise the process or module 917B for eliminating off-track spacetiles.

In some embodiments where the spacetiles have been labeled or marked according to their on-track or off-track characteristics, the method or system may identify the spacetiles associated with the "off-track" label or marking for elimination at 916B. In some embodiments where soft tracks are permitted, the method or system may further respectively, optionally comprise the process or hardware module 918B for determining and associating a cost with the corresponding spacetile. In some embodiments, the associated cost may be textual (e.g., "high", "low", etc.), graphical (e.g., with color labels or symbols), numeric (e.g., an absolute numeric cost measure or a relative cost measure). In some embodiments, the method or system may determine the cost based on, for example, existence or absence of the on-track requirement, exact or approximate distance to the destination using a specific spacetile, number of bends to the destination using a specific spacetile, one or more design rules or the compliance or violation thereof, manufacturability of the route or the electronic design using a specific spacetile, etc.

In some embodiments, the method or system for routing an electronic design using spacetiles by using spacetiles comprises the respective process or hardware module 920B for identifying one or more spacetiles as the corresponding one or more area probes. In some embodiments, the method or system identifies the one or more area probes based on the costs of the corresponding spacetiles. For example, the method or system may identify the spacetile with the lowest cost or the spacetiles with the lower costs as the area probes. In some embodiments, the method or system for routing an electronic design using spacetiles by using spacetiles comprises the respective process or hardware module 922B for routing the electronic design by using the one or more identified area probes to conduct search for viable routing solutions.

Figure 10A:
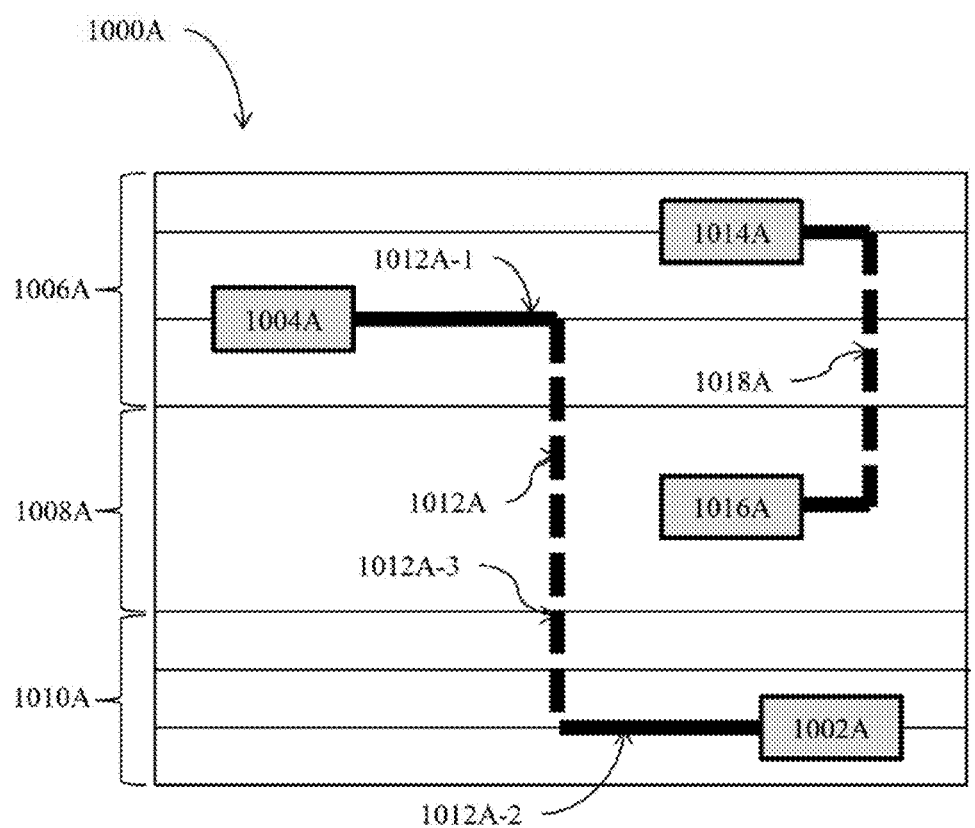

FIGS. 10A-B illustrate some examples of routing a layer of the electronic design that comprises tracked regions with different track spacing distances and a trackless region in some embodiments. More specifically, FIG. 10A illustrates a routing space 1000A, which may be a routing layer or a part thereof and includes a first tracked portion 1006A with a first track spacing, a second tracked portion 1010A with a second track spacing, and a trackless portion 1008A. FIG. 10A further includes two nets, each of which is routed between two pins. For example, the first net comprises the two pins, 1004A and 1002A, and the first interconnect 1012A between 1002A and 1004A; and the second net also comprises two pins, 1014A and 1016A, and the second interconnect 1018A connecting 1014A and 1016A.

FIG. 10A further illustrates that the first interconnect is routed (assuming to go from 1004A to 1002A) to go from the first portion 1006A, which is tracked, into the second portion 1008A, which is trackless, and then back into the third portion 1010A, which is again tracked although at a different track spacing from the first tracked portion 1006A. The second net (assuming the interconnect 1018A is routed from 1014A) also shows that the second interconnect 1018A is first routed in the first tracked portion 1006A and then proceeds into the trackless portion 1008A. Various embodiments described above allow a router to freely transition from a tracked area to a trackless area in the same routing layer by using spacetiles, and vice versa. Various embodiments described above also allow a router to freely transition from a tracked routing layer to another trackless routing layer by using spacetiles and a via spacetile layer, and vice versa. FIG. 10A further illustrates that three pins, 1004A, 1002A, and 1014A, are aligned with some tracks, whereas the fourth pin 1016A is not aligned with any track.

In some embodiments, the routing space 1000A illustrated in FIG. 10A may constitute a, for example, horizontal routing layer, and thus the method or system may determine the two horizontal segments (1012A-1 and 1012A-2) of the first interconnect 1012A in this horizontal routing space or layer 1000A, and the vertical segment (1012A-3) of the first interconnect 1012A on another vertical routing layer (not shown) by using various approaches disclosed herein. In these embodiments, the method or system thus determines the two horizontal segments of the second interconnect 1018A on the routing space 1000A, while determining the vertical segment of the second interconnect 1018A in a vertical routing space or layer, and the method or the system may thus meet the "on track" requirement in both the horizontal and vertical routing layers. FIG. 10A thus illustrates the vertical segments of the first and the second interconnect with a different linetype for clarity. In some embodiments, the method or system may determine the first interconnect in its entirety on the routing space 1000A. In these embodiments, the method or system may thus determine the entire second interconnect 1018A in the routing space 1000A.

FIG. 10B further illustrates the spacetile punch for a pin in some embodiments. In addition to the elements introduced in FIG. 10A, FIG. 10B further shows a close-up view of the result of a spacetile punch for pin 1004A. The method or system may consider a pin as a "seed" and may further mark a pin as such for routing purposes because a pin represents where an interconnect originates. In other words, the method or system need not punch out a space for a pin because an interconnect is supposed to connect to the pin according to connectivity defined by the net including the pin. Nonetheless, the method or system may perform a spacetile punch with respect to the track to which the pin 1004A coincides. The spacetile punch with respect to the track coincident with 1004A subdivides the pin 1004A into three spacetiles—two two-dimensional spacetile 1002B and 1006B and a degenerated spacetile 1004B.

In some embodiments where an on-track requirement is in place and is further associated with a lower cost, the method or system may determine that spacetile 1004B is "on-track" and thus associate a lower cost with the spacetile 1004B. In some other embodiments where hard tracks are used, the method or system may eliminate spacetiles 1004B and 1006B because these two spacetiles are not on-track. In either approach, the method or system may identify the spacetile 1004B as the area probe to perform area search for viable routing solutions. The method or system may determine to route the first segment 1012A(1) based at least in part upon, for example, the destination—1002A. The method or system may similarly determine the third segment 1012A(3) in a substantially similar manner.

In this example, the method or system is made aware of the fact that the tracks in 1006A are associated with finite lengths as well as the destination 1002A. The method or system may then determine that one or more bends are required to route the interconnect between 1002A and 1004A and thus form the second segment—1012A(2). In these embodiments, the second segment 1012A(2) traverses through the first tracked area 1006A, the trackless area 1008A, and the second tracked area 1010A. In some of these embodiments where off-track spacetiles are associated with a higher cost, the method or system may associate such a higher cost for the portions of 1012A(2) in the tracked areas (1006A and 1010A) but not in the trackless area (1008A) because a trackless area has, by nature, no tracks and thus exhibit no on-track or off-track characteristics.

In some other embodiments, the method or system may examine the option of starting the route from the pin 1002A and similarly determine the second alternative segment 1020A(2) based on the track coincident with 1002A and the destination 1004A as shown in FIG. 10B. The method or system is also made aware of the finite length of the track coincident with 1002A and the destination 1004A and thus may determine that one or more bends along the interconnect is needed. In these embodiments, the method or system may determine the first segment 1020A(1) to complete the route with one bend. The method or system may then determine that the alternative routing solution with 1020A(1) and 1020A(2) may constitute a more viable routing solution because of the enhanced manufacturability with only one bend, whereas the higher cost associated with the use of off-track spacetiles between these two routing solutions remain the same because both vertical segments 1020A(2) and 1012A(2) traverse through the same length while staying off-track.

Similarly, the method or the system may identify two routing solutions with the interconnects 1018A for the first routing solution and the interconnect 1022A for the second routing solution. The close-up view illustrates the three spacetiles created by the spacetile punch where the degenerated spacetile 1010B is on track, and the other two spacetiles 1008B and 1012B are not on-track. The method or system may then identify the degenerated spacetile 1010B as the area probe to perform area search for finding a viable solution. In some embodiments where the method or system begins the muting process from pin 1014A with an on-track requirement, the interconnect, as shown in 1018A, traverses toward the right first. Nonetheless, the method or the system is made aware of the finite length of the track as well as the destination 1016A and thus makes two bends to route the interconnect 1018A from the first tracked area 1006A to the trackless area 1008A where the destination pin 1016A is located.

The portion of the vertical segment of 1018A may be associated with a higher cost due to its off-track characteristic in the first tracked area. The portion of the vertical segment of 1018A that lies in the trackless area is not associated with additional cost due to the trackless nature of the area. In some embodiments, the method or the system may associated a cost that is proportional to the length of a route that remains off-track. In the alternative routing solution, the method or system may initiate the routing process from the other pin—1016A, which is in the trackless area 1008A. The method or system is thus not bound by the on-track requirement in this area and thus may determine to route the interconnect 1022A in the vertical direction to minimize the length of the route. Although the on-track requirement in the first tracked area 1006A may prefer the choice of a spacetile that is on-track, the method or system may nonetheless complete the route as a vertical segment 1022A by considering the competition between having multiple bends with longer wire length of using on-track spacetiles in the first tracked area 1006A and the violation of the on-track requirement of the vertical route.

As previously described with reference to FIG. 10A, the routing space 1000A illustrated in FIG. 10B may constitute a, for example, horizontal routing layer, and thus the method or system may determine the two horizontal segments (1012A (1) and 1012A(3)) of the first interconnect 1012A in this horizontal routing space or layer 1000A, and the vertical segment (1012A(3)) of the first interconnect 1012A on another vertical routing layer (not shown) by using various approaches disclosed herein. In these embodiments, the method or system thus determines the two horizontal segments of the second interconnect 1018A on the routing space 1000A, while determining the vertical segment of the second interconnect 1018A or the vertical interconnect 1022A in a vertical routing space or layer, and the method or the system may thus meet the "on track" requirement in both the horizontal and vertical routing layers. FIG. 10B therefore illustrates the vertical segments of the first and the second interconnect with one or more different linetypes for clarity. In some embodiments, the method or system may determine an interconnect in its entirety on the routing space 1000A. In these embodiments, the method or system may thus determine the interconnects in their entireties in the routing space 1000A. The examples illustrated in FIG. 10A and FIG. 10B demonstrate that the method or the system may apply the "on-track" approach in an area.

System Architecture Overview

Figure 11:
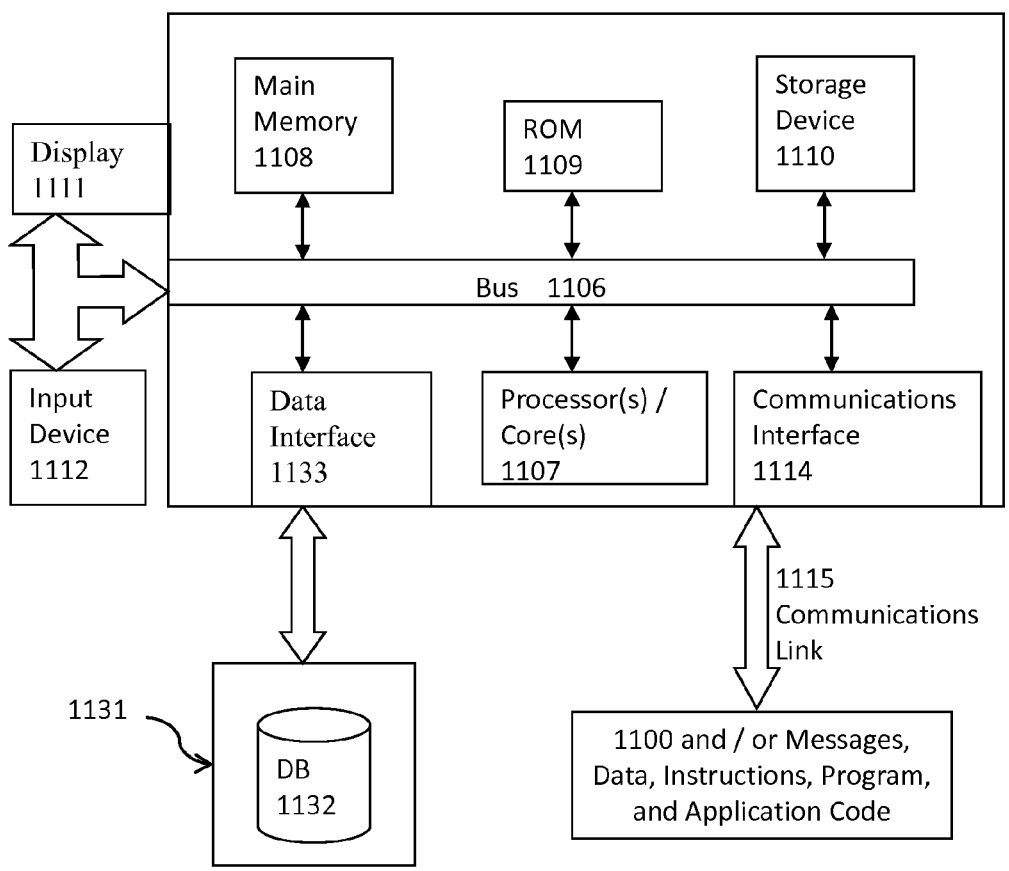
FIG. 11 illustrates a computerized system on which a method for routing an electronic design using spacetiles may be implemented.

FIG. 11 illustrates a block diagram of an illustrative computing system 1100 suitable for routing an electronic circuit using spacetiles as described in the preceding paragraphs with reference to various figures. Computer system 1100 includes a bus 1106 or other communication mechanism for communicating information, which interconnects subsystems and devices, such as processor 1107, system memory 1108 (e.g., RAM), static storage device 1109 (e.g., ROM), disk drive 1110 (e.g., magnetic or optical), communication interface 1114 (e.g., modem or Ethernet card), display 1111 (e.g., CRT or LCD), input device 1112 (e.g., keyboard), and cursor control (not shown).

According to one embodiment, computer system 1100 performs specific operations by one or more processor or processor cores 1107 executing one or more sequences of one or more instructions contained in system memory 1108. Such instructions may be read into system memory 1108 from another computer readable/usable storage medium, such as static storage device 1109 or disk drive 1110. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1107, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1107 for execution. Such a medium may take many forms, including but not limited to, non-volatile media and volatile media. Non-volatile media includes, for example, optical or magnetic disks, such as disk drive 1110. Volatile media includes dynamic memory, such as system memory 1108.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1100. According to other embodiments of the invention, two or more computer systems 1100 coupled by communication link 1115 (e.g., LAN, PTSN, or wireless network) may perform the sequence of instructions required to practice the invention in coordination with one another.

Computer system 1100 may transmit and receive messages, data, and instructions, including program, i.e., application code, through communication link 1115 and communication interface 1114. Received program code may be executed by processor 1107 as it is received, and/or stored in disk drive 1110, or other non-volatile storage for later execution. In an embodiment, the computer system 1100 operates in conjunction with a data storage system 1131, e.g., a data storage system 1131 that contains a database 1132 that is readily accessible by the computer system 1100. The computer system 1100 communicates with the data storage system 1131 through a data interface 1133. A data interface 1133, which is coupled to the bus 1106, transmits and receives electrical, electromagnetic or optical signals that include data streams representing various types of signal information, e.g., instructions, messages and data. In embodiments of the invention, the functions of the data interface 1133 may be performed by the communication interface 1114.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

I claim:

1. A computer implemented method for routing an electronic design using one or more spacetiles, comprising:
   identifying a first routing layer of an electronic design and one or more spacetiles of the first routing layer, in which the first routing layer is gridded and is associated with at least two sets of tracks in two routing directions;
   identifying a second routing layer of the electronic design, in which the second routing layer is gridless;
   identifying or determining a via spacetile layer based at least in part upon the one or more spacetiles for the first routing layer and the second routing layer of the electronic design; and
   routing the electronic design while transitioning between the first routing layer and the second routing layer by using the via spacetile layer.

2. The computer implemented method of claim 1, wherein the first routing layer is gridded.

3. The computer implemented method of claim 1, wherein the second routing layer is trackless.

4. The computer implemented method of claim 1, the process further comprising:
   identifying one or more first features in the first routing layer, and
   creating one or more first spacetiles in the first routing layer by performing a spacetile punch for the first routing layer based at least in part upon some of the one or more first features.

5. The computer implemented method of claim 1, the process further comprising:
   identifying one or more second features in the second routing layer, and
   creating one or more second spacetiles in the second routing layer by performing spacetile punch for the second routing layer based at least in part upon some of the one or more second features.

6. The computer implemented method of claim 5, the process further comprising:
   aggregating the one or more first features and the one or more second features into the via spacetile layer, and
   determining a resulting area probe based at least in part a result of aggregating the one or more first features and the one or more second features into the via spacetile layer.

7. The computer implemented method of claim 1, the process further comprising:
   identifying one or more on-track requirements;
   identifying one or more taper rules; and
   determining a region in the first routing layer or the second routing layer to which the one or more taper rules apply, in which the electronic design is routed according to the one or more on-track requirements or the one or more taper rules based at least in part upon the region.

8. An article of manufacture comprising a non-transitory computer accessible storage medium having stored thereupon a sequence of instructions which, when executed by at least one processor or at least one processor core executing one or more threads, causes the at least one processor or the at least one processor core to perform a method for routing an electronic design using one or more spacetiles, the method comprising:
   identifying a first routing layer of an electronic design and one or more spacetiles of the first routing layer, in which the first routing layer is gridded and is associated with at least two sets of tracks in two routing directions;
   identifying a second routing layer of the electronic design, in which the second routing layer is gridless;
   identifying or determining a via spacetile layer based at least in part upon the one or more spacetiles for the first routing layer and the second routing layer of the electronic design; and
   routing the electronic design while transitioning between the first routing layer and the second routing layer by using the via spacetile layer.

9. The article of manufacture of claim 8, wherein the first routing layer is gridded.

10. The article of manufacture of claim 8, wherein the second routing layer is trackless.

11. The article of manufacture of claim 8, the process further comprising:
    identifying one or more first features in the first routing layer, and
    creating one or more first spacetiles in the first routing layer by performing a spacetile punch for the first routing layer based at least in part upon some of the one or more first features.

12. The article of manufacture of claim 8, the process further comprising:
    identifying one or more second features in the second routing layer, and
    creating one or more second spacetiles in the second routing layer by performing a spacetile punch for the second routing layer based at least in part upon some of the one or more second features.

13. The article of manufacture of claim 12, the process further comprising:
    aggregating the one or more first features and the one or more second features into the via spacetile layer, and
    determining a resulting area probe based at least in part a result of aggregating the one or more first features and the one or more second features into the via spacetile layer.

14. The article of manufacture of claim 8, the process further comprising:
    identifying one or more on-track requirements;
    identifying one or more taper rules; and
    determining a region in the first routing layer or the second routing layer to which the one or more taper rules apply, in which the electronic design is routed according to the one or more on-track requirements or the one or more taper rules based at least in part upon the region.

15. A system for routing an electronic design using one or more spacetiles, comprising:
    at least one processor or at least one processor core that is at least to:
    identify a first routing layer of an electronic design and one or more spacetiles of the first routing layer, in which the first routing layer is gridded and is associated with at least two sets of tracks in two routing directions;
    identify a second routing layer of the electronic design, in which the second routing layer is gridless;
    identify or determine a via spacetile layer based at least in part upon the one or more spacetiles for the first routing layer and the second routing layer of the electronic design; and
    route the electronic design while transitioning between the first routing layer and the second routing layer by using the via spacetile layer.

16. The system of claim 15, wherein the first routing layer is gridded.

17. The system of claim 15, wherein the second routing layer is trackless.

18. The system of claim 15, in which the at least one processor or the at least one processor core is further to:
   identify one or more first features in the first routing layer, and
   create one or more first spacetiles in the first routing layer by performing a spacetile punch for the first routing layer based at least in part upon some of the one or more first features.

19. The system of claim 15, in which the at least one processor or the at least one processor core is further to:
   identify one or more second features in the second routing layer, and
   create one or more second spacetiles in the second routing layer by performing the spacetile punch for the second routing layer based at least in part upon some of the one or more second features.

20. The system of claim 19, in which the at least one processor or the at least one processor core is further to:
   aggregate the one or more first features and the one or more second features into the via spacetile layer, and
   determine a resulting area probe based at least in part a result of aggregating the one or more first features and the one or more second features into the via spacetile layer.

21. The system of claim 15, in which the at least one processor or the at least one processor core is further to:
   identify one or more on-track requirements;
   identify one or more taper rules; and
   determine a region in the first routing layer or the second routing layer to which the one or more taper rules apply, in which the electronic design is routed according to the one or more on-track requirements or the one or more taper rules based at least in part upon the region.

* * * * *